(12) United States Patent
Ko et al.

(10) Patent No.: US 11,690,231 B2
(45) Date of Patent: Jun. 27, 2023

(54) SEMICONDUCTOR DATA STORAGE DEVICES AND METHODS OF FABRICATING THE SAME

(71) Applicant: SAMSUNG ELECTRONICS CO., LTD., Suwon-si (KR)

(72) Inventors: Seung Pil Ko, Hwaseong-si (KR); Yongjae Kim, Suwon-si (KR)

(73) Assignee: SAMSUNG ELECTRONICS CO., LTD.

( * ) Notice: Subject to any disclaimer, the term of this patent is extended or adjusted under 35 U.S.C. 154(b) by 276 days.

(21) Appl. No.: 17/019,641

(22) Filed: Sep. 14, 2020

(65) Prior Publication Data

US 2021/0296397 A1    Sep. 23, 2021

(30) Foreign Application Priority Data

Mar. 18, 2020    (KR) .................. 10-2020-0033457

(51) Int. Cl.
*H10N 50/80* (2023.01)
*H10B 61/00* (2023.01)
*H10N 50/01* (2023.01)

(52) U.S. Cl.
CPC ............ *H10B 61/22* (2023.02); *H10N 50/01* (2023.02); *H10N 50/80* (2023.02)

(58) Field of Classification Search
CPC ....... H01L 27/228; H01L 43/02; H01L 43/12; H10B 61/22; H10N 50/80; H10N 50/01
USPC ......................................................... 257/421
See application file for complete search history.

(56) References Cited

U.S. PATENT DOCUMENTS

| | | | |
|---|---|---|---|
| 8,455,267 B2 | 6/2013 | Li et al. | |
| 8,735,179 B2 | 5/2014 | Li et al. | |
| 9,406,875 B2 | 8/2016 | Li et al. | |
| 9,842,986 B2 | 12/2017 | Chuang et al. | |
| 9,917,137 B1 | 3/2018 | Briggs et al. | |
| 10,121,964 B2 | 11/2018 | Tan et al. | |
| 10,164,169 B2 | 12/2018 | Chuang et al. | |
| 10,199,572 B2 | 2/2019 | Yl et al. | |
| 10,290,679 B1 | 5/2019 | Bhushan et al. | |
| 10,347,825 B2 | 7/2019 | Briggs et al. | |

(Continued)

OTHER PUBLICATIONS

Ohmi et al., ACS Omega, 4, 2, 4360-4366 (2019).
Ohmi et al., Appl. Phys. Lett., 109, 21603 (2016).

*Primary Examiner* — Jami Valentine Miller
(74) *Attorney, Agent, or Firm* — Fish & Richardson P.C.

(57) ABSTRACT

A method of fabricating a semiconductor device including providing a substrate; forming first and second lower conductive patterns, the and second lower conductive patterns being buried in an interlayer dielectric layer; forming a capping layer on the interlayer dielectric layer and a dummy layer on the capping layer; etching an exposed upper portion of the first lower conductive pattern to form a trench; forming a metal layer that covers the interlayer dielectric layer and the dummy layer such that the metal layer fills the trench; forming a magnetic tunnel junction layer on the metal layer; performing a patterning process to form a memory cell; and forming a first protective layer that covers a lateral surface of the memory cell, wherein, in the patterning process, the metal layer on the top surface of the interlayer dielectric layer is etched to form a first bottom electrode in the trench.

19 Claims, 26 Drawing Sheets

(56) References Cited

U.S. PATENT DOCUMENTS

| | | |
|---|---|---|
| 2014/0131786 A1* | 5/2014 | Ryu .................... H01L 27/1052 |
| | | 257/316 |
| 2017/0084819 A1 | 3/2017 | Lu et al. |
| 2018/0233663 A1 | 8/2018 | Shum et al. |
| 2018/0308899 A1 | 10/2018 | Chuang et al. |
| 2019/0081233 A1 | 3/2019 | Lee et al. |
| 2019/0148633 A1 | 5/2019 | Dai et al. |
| 2019/0165041 A1 | 5/2019 | Chuang et al. |
| 2019/0165042 A1 | 5/2019 | Clevenger et al. |
| 2019/0280196 A1 | 9/2019 | Clevenger et al. |
| 2021/0296237 A1* | 9/2021 | Kim .................. H01L 21/76805 |

* cited by examiner

SEMICONDUCTOR DATA STORAGE DEVICES AND METHODS OF FABRICATING THE SAME

CROSS-REFERENCE TO RELATED APPLICATION

Korean Patent Application No. 10-2020-0033457, filed on Mar. 18, 2020, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

An embedded semiconductor device may include a memory element and a logic element integrated together on one chip. The embedded semiconductor device may include a main memory element configured to store user data and a functional circuit configured to process specific functions demanded by a user.

The main memory element may have non-volatile characteristics to maintain user data even when no power is supplied. A flash memory device may be used as the main memory element of some embedded semiconductor devices because the flash memory device may achieve the non-volatile characteristics of data.

SUMMARY

The embodiments may be realized by providing a method of fabricating a semiconductor device, the method including providing a substrate that includes a first region and a second region; forming a first lower conductive pattern on the first region and a second lower conductive pattern on the second region, the first lower conductive pattern and the second lower conductive pattern being buried in an interlayer dielectric layer on the substrate; forming a capping layer on the interlayer dielectric layer and a dummy layer on the capping layer, the capping layer covering the second region; etching an upper portion of the first lower conductive pattern to form a trench on the first region, the first lower conductive pattern being exposed at a top surface of the interlayer dielectric layer; forming a metal layer that covers the interlayer dielectric layer on the first region and the dummy layer on the second region such that the metal layer fills the trench on the first region; forming a magnetic tunnel junction layer on the metal layer; performing a patterning process to pattern the magnetic tunnel junction layer to form a memory cell; and forming a first protective layer that covers the second region and a lateral surface of the memory cell, wherein, in the patterning process, the metal layer on the top surface of the interlayer dielectric layer is etched to form a first bottom electrode in the trench.

The embodiments may be realized by providing a method of fabricating a semiconductor device, the method including providing a substrate that includes a first region and a second region; forming a first lower conductive pattern on the first region and a second lower conductive pattern on the second region, the first lower conductive pattern and the second lower conductive pattern being buried in an interlayer dielectric layer on the substrate; forming a capping layer and a dummy layer on the capping layer, the capping layer covering the interlayer dielectric layer on the second region; forming a conductive layer and a magnetic tunnel junction layer on the conductive layer, the conductive layer covering the interlayer dielectric layer on the first region and the dummy layer on the second region; performing a first etching process on the magnetic tunnel junction layer to form a memory cell; forming a protective layer that covers a lateral surface of the memory cell; performing a second etching process on the protective layer and the conductive layer at one side of the memory cell, the second etching process forming an inner protective layer on the lateral surface of the memory cell and a first bottom electrode between the first lower conductive pattern and the memory cell; and forming an outer protective layer that covers an outer surface of the inner protective layer, a top surface of the interlayer dielectric layer exposed by the second etching process, and the second region.

The embodiments may be realized by providing a semiconductor device including a substrate that includes a first region and a second region; a first lower conductive pattern on the first region of the substrate; a second lower conductive pattern on the second region of the substrate; a plurality of upper conductive patterns on the first lower conductive pattern and the second lower conductive pattern; a memory cell on the first region of the substrate and serially connecting the first lower conductive pattern to one of the upper conductive patterns, the memory cell including a bottom electrode, a magnetic tunnel junction, and a top electrode; and a through electrode on the second region of the substrate and connecting the second lower conductive pattern to another of the upper conductive patterns, wherein a top surface of the first lower conductive pattern is at a level lower than a level of a top surface of the second lower conductive pattern, and the bottom electrode has a lateral surface, a top surface in contact with the magnetic tunnel junction, and a connection surface between the lateral surface and the top surface, the connection surface being inclined relative to the lateral surface.

The embodiments may be realized by providing a semiconductor device including a substrate that includes a first region and a second region; a first lower conductive pattern on the first region of the substrate; a second lower conductive pattern on the second region of the substrate; a plurality of upper conductive patterns on the first lower conductive pattern and the second lower conductive pattern; a memory cell on the first region of the substrate and serially connecting the first lower conductive pattern to one of the upper conductive patterns, the memory cell including a bottom electrode, a magnetic tunnel junction, and a top electrode; a through electrode on the second region of the substrate and connecting the second lower conductive pattern to another of the upper conductive patterns; an inner protective layer surrounding the memory cell on the first region; and an outer protective layer covering the inner protective layer on the first region and the second lower conductive pattern on the second region, wherein the first bottom electrode includes a lower segment in contact with the first lower conductive pattern; and an upper segment surrounded by the inner protective layer, the upper segment being on the lower segment, and a lateral surface of the first bottom electrode is continuous with an outer surface of the inner protective layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
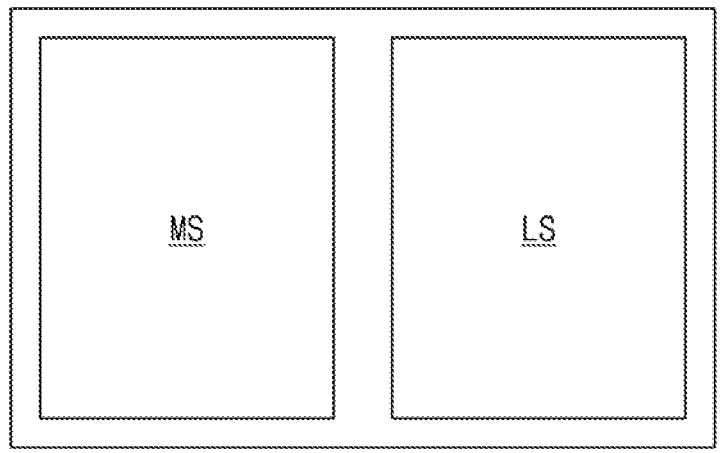
FIG. 1 illustrates a simplified block diagram of a semiconductor device according to some example embodiments.

FIG. 1 illustrates a simplified block diagram of a semiconductor device according to some example embodiments.

Referring to FIG. 1, a semiconductor device may include a memory structure MS and a logic structure LS that are provided on a substrate. The memory structure MS may include a memory cell array. In an implementation, the memory cell array may include a plurality of memory cells that are arranged two-dimensionally or three-dimensionally, a plurality of word lines electrically connected to the memory cells, a plurality of bit lines electrically connected to the memory cells, and a plurality of source lines electrically connected to the memory cells. Each of the memory cells may include a memory element and a selection element. In an implementation, the memory element may be a variable resistance device that can be switched from one to the other of its two resistance states by an applied electrical pulse. The selection element may be configured to selectively control flow of charges passing through the memory element. In an implementation, the selection element may include a PMOS or NMOS field effect transistor.

The logic structure LS may include logic circuits for performing certain logic operations and/or memory peripheral circuits for driving the memory cells. The logic circuits may include logic cells for performing, e.g., a Boolean logic function (e.g., INVERTER, AND, OR, NAND, NOR, etc.) or a storage function (e.g., FLIP-FLOP). The memory peripheral circuits may include a row decoder, a column selection circuit, a read/write circuit, and/or a control logic for driving (e.g., read or write operation) the memory cell. In an implementation, the logic structure LS may include a plurality of CMOS transistors that constitute the logic circuits or the memory peripheral circuits, and also include a connection structure connected to the CMOS transistors.

Figure 2:
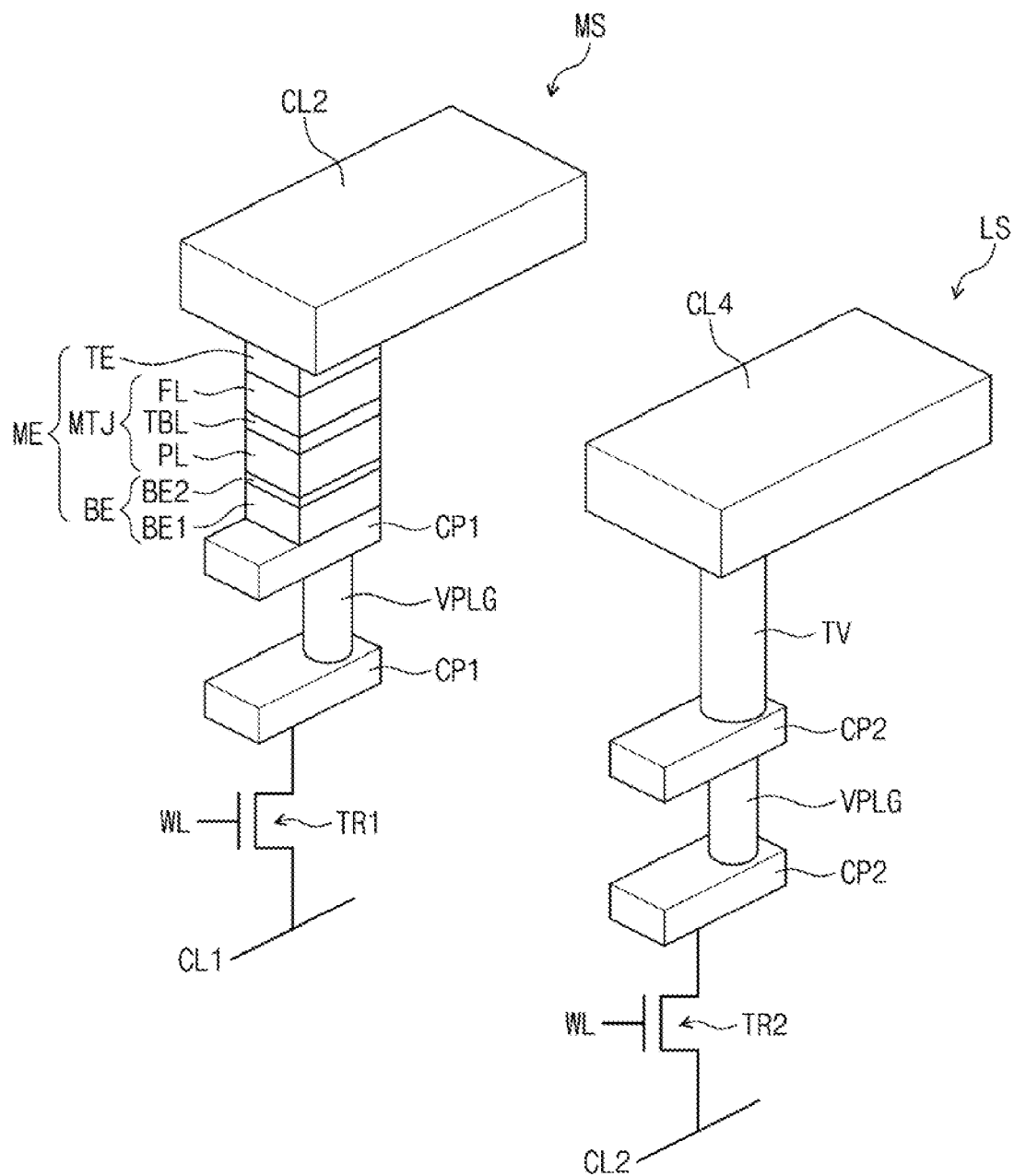
FIG. 2 illustrates a simplified schematic diagram of a semiconductor device according to some example embodiments.

FIG. 2 illustrates a simplified schematic diagram of a semiconductor device according to some example embodiments.

FIG. 2 roughly shows the memory structure MS and the logic structure LS that are discussed with reference to FIG. 1.

The memory structure MS may include a memory cell including a memory element ME and a transistor TR1.

The memory element ME may have a thin-film structure whose electrical resistance can be changed using a spin transferring phenomenon of electrical current flowing through the memory element ME. The memory element ME may include a thin-film structure configured to exhibit magneto-resistance properties, and may include at least one ferromagnetic material and/or at least one anti-ferromagnetic material. In an implementation, the memory element ME may be a magnetic memory device including a magnetic tunnel junction MTJ.

In an implementation, the magnetic tunnel junction MTJ may include a pinned layer PL and a free layer FL, and a tunnel barrier layer TBL interposed therebetween. The pinned layer PL may have a magnetization direction fixed in one direction, and the free layer FL may have a magnetization direction capable of being orientated parallel or anti-parallel to the magnetization direction of the pinned layer PL. The magnetic tunnel junction MTJ may have its electrical resistance that is changed depending on the magnetization directions of the pinned layer PL and the free layer FL. When the pinned layer PL and the free layer FL have parallel magnetization directions, the magnetic tunnel junction MTJ may have a low resistance state and may be written with '0' corresponding to a first data. In contrast, when the pinned layer PL and the free layer FL have antiparallel magnetization directions, the magnetic tunnel junction MTJ may have a high resistance state and may be written with '1' corresponding to a second data.

Figure 3:
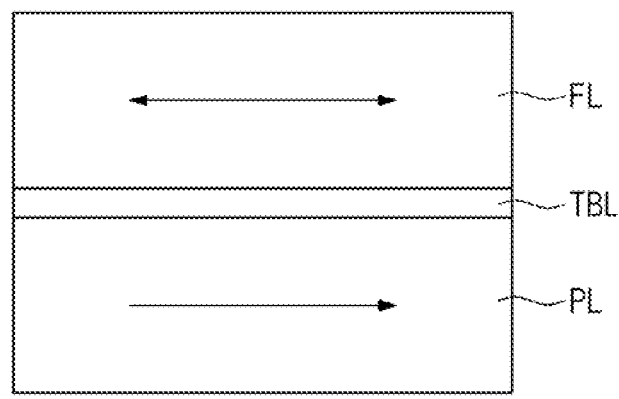
FIG. 3 illustrates a conceptual diagram of a magnetic tunnel junction according to some example embodiments.

The following will describe in detail the magnetic tunnel junction MTJ with reference to FIG. 3. FIG. 3 illustrates a conceptual diagram of a magnetic tunnel junction according to some example embodiments.

The magnetic tunnel junction MTJ may have an electrical resistance that depends on the magnetization directions of the pinned layer PL and the free layer FL. In an implementation, the electrical resistance of the magnetic tunnel junction MTJ may be much greater when the pinned and free layers PL and FL have antiparallel magnetization directions than when the pinned and free layers PL and FL have parallel magnetization directions. Consequently, the electrical resistance of the magnetic tunnel junction MTJ may be adjusted by changing the magnetization direction of the free layer FL, which may be used as a data storage principle of a magnetic memory device according to some example embodiments.

Referring to FIG. 3, the pinned layer PL and the free layer FL may be magnetic layers configured to form an in-plane magnetization structure in which the pinned layer PL and the free layer FL have magnetization directions substantially parallel to a top surface of the tunnel barrier layer TBL. In this case, the pinned layer PL may include a layer having an anti-ferromagnetic material and a layer having a ferromagnetic material. In an implementation, the layer having an anti-ferromagnetic material may include, e.g., PtMn, IrMn, MnO, MnS, MnTe, $MnF_2$, $FeCl_2$, FeO, $CoCl_2$, CoO, $NiCl_2$, NiO, or Cr. In an implementation, the layer having an anti-ferromagnetic material may include a precious metal. The precious metal may include, e.g., ruthenium (Ru), rhodium (Rh), palladium (Pd), osmium (Os), iridium (Ir), platinum (Pt), gold (Au), or silver (Ag). The layer having a ferromagnetic material may include, e.g., CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$. As used herein, the term "or" is not an exclusive term, e.g., "A or B" would include A, B, or A and B.

The free layer FL may include a material having a changeable magnetization direction. The free layer FL may include a ferromagnetic material. In an implementation, the free layer FL may include, e.g., CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$. The free layer FL may include a plurality of layers. In an implementation, the free layer FL may include layers having a plurality of ferromagnetic materials and a layer having a non-magnetic material therebetween. In this case, the layers having the ferromagnetic materials and the layer having the non-magnetic material may constitute a synthetic anti-ferromagnetic layer. The synthetic anti-ferromagnetic layer may reduce critical current density and increase thermal stability of a magnetic memory device.

The tunnel barrier layer TBL may include, e.g., an oxide of magnesium (Mg), an oxide of titanium (Ti), an oxide of aluminum (Al), an oxide of magnesium-zinc (MgZn), an oxide of magnesium-boron (MgB), a nitride of titanium (Ti), or a nitride of vanadium (V). In an implementation, the tunnel barrier layer TBL may be a monolayer of magnesium oxide (MgO). In an implementation, the tunnel barrier layer TBL may include a plurality of layers.

In an implementation, the pinned layer PL and the free layer FL may each have a perpendicular magnetization structure whose magnetization direction is substantially perpendicular to the top surface of the tunnel barrier layer TBL. In this case, each of the pinned layer PL and the free layer FL may include a material having an $L_{10}$ crystal structure, a material having a closed-packed hexagonal lattice, and an amorphous rare-earth transition metal (RE-TM) alloy. In an implementation, each of the pinned layer PL and the free layer FL may include a material having an $L_{10}$ crystal structure, e.g., $Fe_{50}Pt_{50}$, $Fe_{50}Pd_{50}$, $Co_{50}Pt_{50}$, $Co_{50}Pd_{50}$, $Fe_{50}Ni_{50}$, etc. In an implementation, each of the pinned layer PL and the free layer FL may include a $Co_3Pt$ ordered alloy or a cobalt-platinum (CoPt) disordered alloy that have a hexagonal close-packed lattice and a platinum (Pt) content ranging from 10 to 45 at %. In an implementation, each of the pinned layer PL and the free layer FL may include amorphous RE-TM alloys that contain at least one selected from iron (Fe), cobalt (Co), and nickel (Ni) and at least one of rare earth metals such as terbium (Tb), dysprosium (Dy), and gadolinium (Gd).

The pinned layer PL and the free layer FL may include a material having interface perpendicular magnetic anisotropy. The interface perpendicular magnetic anisotropy may refer to a phenomenon where a magnetic layer having intrinsic in-plane magnetization properties is caused to have a perpendicular magnetization direction due to an effect from an interface with another layer adjacent to the magnetic layer. Herein, the term "intrinsic in-plane magnetic properties" may mean that a magnetic layer has a magnetization direction parallel to its widest surface when there is no external factor. In an implementation, each of the pinned layer PL and the free layer FL may include cobalt (Co), iron (Fe), or nickel (Ni). In an implementation, each of the pinned layer PL and the free layer FL may further include a non-magnetic material including boron (B), zinc (Zn), aluminum (Al), titanium (Ti), ruthenium (Ru), tantalum (Ta), silicon (Si), silver (Ag), gold (Au), copper (Cu), carbon (C), or nitrogen (N). In an implementation, each of the pinned layer PL and the free layer FL may include CoFe or NiFe and may further include boron (B). In an implementation, in order to reduce saturation magnetization, each of the pinned layer PL and the free layer FL may further include titanium (Ti), aluminum (Al), magnesium (Mg), tantalum (Ta), or silicon (Si).

Referring back to FIG. 2, the first transistor TR1 may be the selection element of the memory structure MS discussed with reference to FIG. 1. The first transistor TR1 may have a gate electrode connected to a corresponding one of word lines WL, a first terminal connected to a first conductive line CL1, and a second terminal connected through the magnetic tunnel junction MTJ to a corresponding second conductive line CL2. In an implementation, the first conductive line CL1 may correspond to a source line electrically connected to a source of the first transistor TR1, and the second conductive line CL2 may correspond to a bit line electrically connected to a drain of the first transistor TR1. In an implementation, the second conductive line CL2 may correspond to a source line electrically connected to a source of the first transistor TR1, and the first conductive line CL1 may correspond to a bit line electrically connected to a drain of the first transistor TR1.

A plurality of first conductive patterns CP1 may be electrically connected to the first terminal of the first transistor TR1. The first conductive patterns CP1 may be vertically stacked spaced apart from each other. The vertically neighboring first conductive patterns CP1 may be connected to each other through a first via plug VPLG1 interposed therebetween. The memory element ME may be on a topmost first conductive pattern CP1, and may be connected to the topmost first conductive pattern CP1 through a bottom electrode BE of the memory element ME. A bottommost first conductive pattern CP1 may be connected through a contact plug to the second terminal of the first transistor TR1. In an implementation, two first conductive patterns CP1 may be between the memory element ME and the second terminal of the first transistor TR1. In an implementation, one or at least three first conductive patterns CP1 may be provided between the memory element ME and the second terminal of the first transistor TR1.

In an implementation, the memory element ME may further include a bottom electrode BE and a top electrode TE. The magnetic tunnel junction MTJ may be between the bottom electrode BE and the top electrode TE. In an implementation, the bottom electrode BE may be between the magnetic tunnel junction MTJ and the topmost first conductive pattern CP1, and the top electrode TE may be disposed between the magnetic tunnel junction MTJ and the second conductive line CL2. The bottom electrode BE may include a first bottom electrode BE1 and a second bottom electrode BE2 that are stacked on each other. Each of the bottom and top electrodes BE and TE may include a different material from that of the first conductive patterns CP1. In an implementation, the bottom and top electrodes BE and TE may include conductive metal nitrides (titanium nitride, tantalum nitride, etc), transition metal (titanium, tantalum, etc), or rare-earth metals (ruthenium, platinum, etc). The memory structure MS of FIG. 1 may be constituted by the memory element ME, the first transistor TR1, the conductive lines CL1 and CL2, the first conductive patterns CP1, and the first via plugs VPLG1.

In an implementation, as illustrated in FIG. 2, the free layer FL may be connected to the second conductive line CL2 and the pinned layer PL may be connected to the first transistor TR1. In an implementation, differently from that shown in FIG. 2, the pinned layer PL may be connected to the second conductive line CL2 and the free layer FL may be connected to the first transistor TR1.

The logic structure LS may include a through electrode TV that extends vertically and a second transistor TR2. The second transistor TR2 may be the memory peripheral circuits for driving the memory cells and/or the logic circuits of the logic structure LS discussed with reference to FIG. 1. The second transistor TR2 may have a gate electrode connected to a corresponding one of word lines WL, a first terminal connected to a third conductive line CL3, and a second terminal connected via the through electrode TV to a corresponding fourth conductive line CL4. In an implementation, the third conductive line CL3 may correspond to a source line electrically connected to a source of the second transistor TR2, and the fourth conductive line CL4 may correspond to a bit line electrically connected to a drain of the second transistor TR2. In an implementation, the fourth conductive line CL4 may correspond to a source line electrically connected to a source of the second transistor TR2, and the third conductive line CL3 may correspond to a bit line electrically connected to a drain of the second transistor TR2.

A plurality of second conductive patterns CP2 may be electrically connected to the second terminal of the second transistor TR2. The second conductive patterns CP2 may be vertically stacked spaced apart from each other. The vertically neighboring second conductive patterns CP2 may be connected to each other through a via plug VPLG therebetween. The through electrode TV may be on and in contact with a topmost second conductive pattern CP2. A bottommost second conductive pattern CP2 may be connected through a contact plug to the second terminal of the second transistor TR2. In an implementation, as illustrated in FIG. 2, two second conductive patterns CP2 are interposed between the through electrode TV and the second terminal of the second transistor TR2. In an implementation, one or at least three second conductive patterns CP2 may be provided between the through electrode TV and the second terminal of the second transistor TR2.

Figure 4:
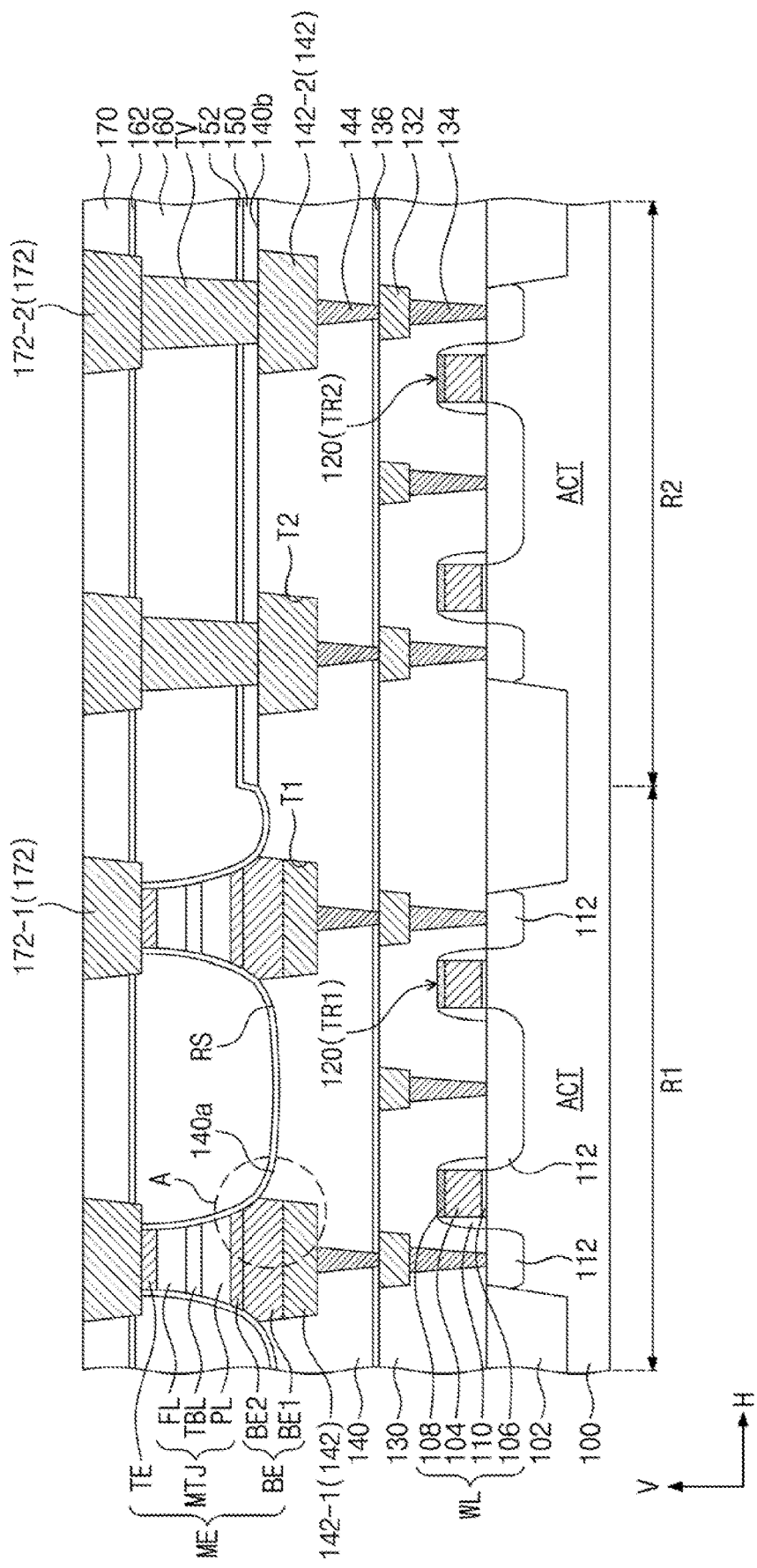
FIG. 4 illustrates a cross-sectional view of a semiconductor device according to some example embodiments.

FIG. 4 illustrates a cross-sectional view of a semiconductor device according to some example embodiments.

Referring to FIG. 4, a substrate 100 may be provided. The substrate 100 may be a silicon substrate, a silicon-germanium substrate, a germanium substrate, or a single-crystalline epitaxial layer grown on a single-crystalline silicon substrate. In an implementation, the substrate 100 may be a silicon substrate having a first conductivity type (e.g., p-type). The substrate 100 may have a first region R1 and a second region R2. The first region R1 and the second region R2 may be horizontally spaced apart from each other (e.g., in a horizontal direction H). The first region R1 may be defined to refer to an area where is provided the memory structure MS discussed with reference to FIG. 1, and the second region R2 may be defined to refer to an area where is provided the logic structure LS discussed with reference to FIG. 1.

The substrate 100 may be provided thereon with integrated transistors 120.

At least one transistor 120 may be on the substrate 100. The substrate 100 may be provided therein with a device isolation layer 102 that defines active regions ACT. The device isolation layer 102 may include a dielectric material, such as nitride or oxide. The active regions ACT may be spaced apart from each other. In an implementation, when viewed in plan, the active regions ACT may be two-dimensionally arranged along a plurality of rows and a plurality of columns. The active regions ACT may be doped with impurities having the first conductivity type.

The substrate 100 may be provided thereon with word lines WL that run across the active regions ACT. The word lines WL may each include a gate electrode 104 on the substrate 100, a gate dielectric layer 106 between the gate electrode 104 and the active region ACT, and a gate mask pattern 108 on the gate electrode 104. The gate electrode 104 may include a semiconductor material such as doped silicon; a metallic material such as tungsten, aluminum, titanium, or tantalum; a conductive metal nitride material such as titanium nitride, tantalum nitride, or tungsten nitride; or a metal-semiconductor compound such as metal silicide. The gate dielectric layer 106 may include, e.g., an oxide, a nitride, an oxynitride, or a high-k dielectric such as hafnium oxide. The gate mask pattern 108 may include, e.g., an oxide, a nitride, or an oxynitride. Gate spacers 110 may be on sidewalls of the gate electrode 104. The gate spacers 110 may include silicon nitride or silicon oxynitride. In an implementation, the gate dielectric layer 106 may extend between the gate electrode 104 and the gate spacers 110.

Impurity regions 112 may be in or at edges of the active region ACT on opposite sides of the word line WL. The impurity regions 112 may correspond to source/drain sections of the transistors 120. The impurity regions 112 may be doped with impurities having a second conductivity type different from the first conductivity type of the active regions ACT. One of the first and second conductivity type impurities may be an n-type dopant, and the other of the first and second conductivity type impurities may be a p-type dopant. The transistors 120 may be, e.g., planar transistors.

The transistors 120 may include first transistors TR1 on the first region R1 and second transistors TR2 on the second region R2. The first transistor TR1 may be the selection element of the memory structure MS discussed with reference to FIG. 1. The second transistor TR2 may be the memory peripheral circuit for driving the memory cells and/or the logic circuit of the logic structure LS discussed with reference to FIG. 1.

In an implementation, the active regions ACT may include fins that protrude in a vertical direction from the substrate 100. In an implementation, the transistors 120 may have structures of FinFET devices. The following will focus on the embodiment of FIG. 4.

In an implementation, the substrate 100 may further be provided thereon with a passive device such as a resistor or a capacitor. The resistor or the capacitor may be provided on the second region R2, and the second transistor TR2 together with the resistor or the capacitor may constitute the logic circuit and/or the memory peripheral circuit for driving the memory cells.

The substrate 100 may be provided thereon with a first interlayer dielectric layer 130 that covers the word lines WL. The first interlayer dielectric layer 130 may include, e.g., silicon oxide, silicon nitride, or silicon oxynitride.

A plurality of first lower conductive patterns 132 may be in the first interlayer dielectric layer 130. The first lower conductive patterns 132 may be coupled to the impurity regions 112 through first contact plugs 134 that penetrate the first interlayer dielectric layer 130. On one active region ACT, a pair of first contact plugs 134 coupled to the impurity regions 112 may be horizontally spaced apart from each other across one word line WL. A portion of the first lower conductive pattern 132 connected to a source of the first transistor TR1 may correspond to a source line of the first transistor TR1. In an implementation, a portion of the first lower conductive pattern 132 connected to a source of the first transistor TR1 may correspond to a bit line.

A first etch stop layer 136 and a second interlayer dielectric layer 140 may be sequentially on the first interlayer dielectric layer 130. The first etch stop layer 136 may include silicon nitride or silicon carbonitride. The second interlayer dielectric layer 140 may include silicon oxide, silicon nitride, or silicon oxynitride. The first and second interlayer dielectric layers 130 and 140 and the first etch stop layer 136 therebetween may be collectively defined as a lower dielectric layer.

A plurality of second lower conductive patterns 142 may be in the second interlayer dielectric layer 140. The second lower conductive patterns 142 may be coupled to corresponding first lower conductive patterns 132 through second contact plugs 144 that penetrate the second interlayer dielectric layer 140 and the first etch stop layer 136. The second lower conductive patterns 142 and the second contact plugs 144 may include the same material as that of the first lower conductive patterns 132. In an implementation, the second lower conductive patterns 142 and the second contact plugs 144 may include copper.

The second lower conductive patterns 142 may include first conductive patterns 142-1 on the first region R1 and second conductive patterns 142-2 on the second region R2. The first conductive pattern 142-1 may be connected to the first transistor TR1, and the second conductive pattern 142-2 may be connected to the second transistor TR2. On the first region R1, the first conductive pattern 142-1 may have a top surface (e.g., surface facing away from the substrate 100 in a vertical direction V) at a lower level than that of a top surface of the second interlayer dielectric layer 140 (e.g., the top surface of the first conductive pattern 142-1 may be closer to the substrate 100 in the vertical direction V than the top surface of the second interlayer dielectric layer 140 is to the substrate 100 in the vertical direction V). In an implementation, on the first region R1, the second interlayer dielectric layer 140 may have first trenches T1 therein that are formed directed toward (e.g., that downwardly extend in the vertical direction V toward) the substrate 100 from the top surface of the second interlayer dielectric layer 140, and the first conductive patterns 142-1 may fill lower portions of the first trenches T1 without filling upper portions of the first trenches T1. On the second region R2, the second conductive pattern 142-2 may have a top surface at substantially the same level as that of the top surface of the second interlayer dielectric layer 140 (e.g., the top surface of the second conductive pattern 142-2 may be about the same distance from the substrate 100 in the vertical direction V as the top surface of the second interlayer dielectric layer 140 is to the substrate 100 in the vertical direction V). In an implementation, on the second region R2, the second interlayer dielectric layer 140 may have second trenches T2 therein extending depthwise in the vertical direction V toward the substrate 100 from the top surface of the second interlayer dielectric layer 140, and the second conductive patterns 142-2 may completely fill the second trenches T2. In this case, the top surface of the first conductive pattern 142-1 may be located at a lower level than that of the top surface of the second conductive pattern 142-2. The first conductive pattern 142-1 may have a bottom surface (e.g., substrate 100-facing surface) at the same level as that of a bottom surface of the second conductive pattern 142-2. The first conductive pattern 142-1 may be located at a lower level than that of the top surface of the second interlayer dielectric layer 140. The first trenches T1 may have their widths (e.g., as measured in the horizontal direction H) each of which decreases as approaching the substrate 100 (e.g., may have a tapered shape). In an implementation, the first conductive pattern 142-1 may have a width that decreases as approaching the substrate 100.

The second interlayer dielectric layer 140 on the second region R2 may have a second top surface 140b that is flat, and the second interlayer dielectric layer 140 on the first region R1 may have a first top surface 140a that is curved toward the substrate 100. The first top surface 140a may have a shape that is recessed downwardly from or relative to a plane of the second top surface 140b. In an implementation, the second interlayer dielectric layer 140 may have recessions or recesses RS that are protrude downwardly in the vertical direction V toward the substrate 100 from (e.g., the plane of) the top surface of the second interlayer dielectric layer 140. On the first region R1, the recesses RS may be positioned adjacent to the first trenches T1. The recesses RS may be spaced apart from the first conductive patterns 142-1. The recesses RS may have bottommost ends (e.g., ends that are proximate to the substrate 100 in the vertical direction V) at a higher level than that of the top surface of the first conductive pattern 142-1.

A capping layer 150 may be on the second interlayer dielectric layer 140. The capping layer 150 may cover the second interlayer dielectric layer 140 on the second region R2 and may expose (e.g., may not cover) the second interlayer dielectric layer 140 on the first region R1. The capping layer 150 may include silicon nitride or silicon carbonitride.

A memory element ME may be provided on the substrate 100. The memory element ME may be on the first region R1 of the substrate 100. The memory element ME may be on the second interlayer dielectric layer 140. When the memory element ME is provided in plural, the plurality of memory elements ME may have their island shapes that are two-dimensionally arranged. Each of the memory elements ME may have a width (e.g., measured in the horizontal direction H) that decreases with increasing distance from the substrate 100 (e.g., along the vertical direction V).

The memory element ME may have a thin-film structure whose electrical resistance can be changed using a spin transferring phenomenon of electrical current flowing through the memory element ME. The memory element ME may have a thin-film structure configured to exhibit magneto-resistance properties, and may include a ferromagnetic material or an anti-ferromagnetic material. In an implementation, the memory element ME may be a magnetic memory device including a magnetic tunnel junction MTJ.

The magnetic tunnel junction MTJ may include a pinned layer PL, a free layer FL, and a tunnel barrier layer TBL (between the pinned layer PL and the free layer FL). The pinned layer PL may have a magnetization direction fixed in one direction, and the free layer FL may have a magnetization direction capable of being orientated parallel or antiparallel to the magnetization direction of the pinned layer PL. The magnetic tunnel junction MTJ may have its electrical resistance that is changed depending on the magnetization directions of the pinned layer PL and the free layer FL. The pinned layer PL, the tunnel barrier layer TBL, and the free layer FL may be the same as or similar to those discussed with reference to FIG. 3.

The memory element ME may further include a bottom electrode BE and a top electrode TE. The magnetic tunnel junction MTJ may be between the bottom electrode BE and the top electrode TE. In an implementation, the bottom electrode BE may be between the first conductive pattern 142-1 and the magnetic tunnel junction MTJ, and the top electrode TE may be on the magnetic tunnel junction MTJ.

Figure 5:
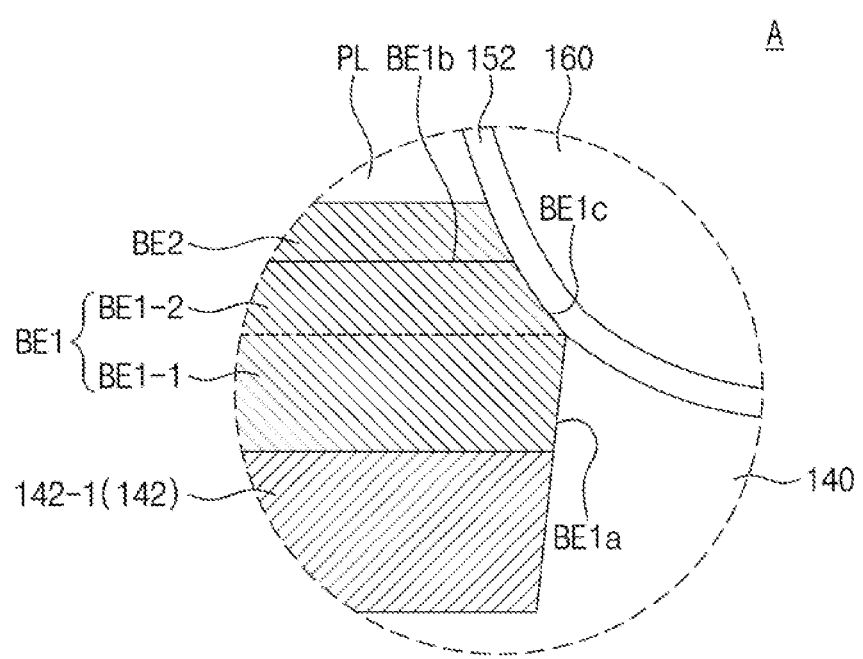
FIG. 5 illustrates an enlarged view of section A of FIG. 4.

The bottom electrode BE may include a first bottom electrode BE1 and a second bottom electrode BE2 on the first bottom electrode BE1. FIG. 5 illustrates an enlarged view of section A of FIG. 4.

Referring to FIGS. 4 and 5, the first bottom electrode BE1 may be in the first trench T1 of the second interlayer dielectric layer 140. In an implementation, the first conductive pattern 142-1 may fill a lower portion of the first trench T1 (e.g., a portion proximate to the substrate 100 in the vertical direction V), and the first bottom electrode BE1 may fill an upper portion of the first trench T1 (e.g., a portion distal to the substrate 100 in the vertical direction V). The first bottom electrode BE1 may directly contact the first conductive pattern 142-1. The first bottom electrode BE1 and the first conductive pattern 142-1 may have the same width (e.g., in the horizontal direction H) at an interface between the first bottom electrode BE1 and the first conductive pattern 142-1. The width of the first bottom electrode BE1 may increase and then decrease with increasing distance (e.g., in the vertical direction V) from the substrate 100. The first bottom electrode BE1 may protrude from or above the top surface of the second interlayer dielectric layer 140 (e.g., away from the substrate 100 in the vertical direction V). In an implementation, the first bottom electrode BE1 may have a lower segment BE1-1 that fills the upper portion of the first trench T1, and may also have an upper segment BE1-2 that is on the lower segment BE1-1 and is at a higher level (e.g., farther from the substrate 100 in the vertical direction V) than that of the top surface of the second interlayer dielectric layer 140. The lower segment BE1-1 and the upper segment BE1-2 may have the same width at a contact surface or interface between the lower and upper segments BE1-1 and BE1-2 of the first bottom electrode BE1. In an implementation, the width of the upper segment BE1-2 may be greater than that of the lower segment BE1-1. In an implementation, the upper segment BE1-2 may protrude from (e.g., outwardly in the horizontal direction H beyond) one side of the lower segment BE1-1.

The first bottom electrode BE1 may have a lateral surface BE1a, a top surface BE1b, and a connection surface BE1c that connects the lateral surface BE1a to the top surface BE1b. The lateral surface BE1a may be a lateral surface of the lower segment BE1-1 of the first bottom surface BE1, and the connection surface BE1c may be a lateral surface of the upper segment BE1-2 of the first bottom electrode BE1. The connection surface BE1c may be inclined relative to the lateral surface BE1a. In an implementation, the connection surface BE1c may be a substantially concave surface that is concave inwardly toward the first bottom electrode BE1, or may be a substantially flat surface. A contact point between the connection surface BE1c and the lateral surface BE1a may be at a level the same as or lower (e.g., closer to the substrate 100 in the vertical direction V) than that of the second top surface 140b of the second interlayer dielectric layer 140 on the second region R2. The connection surface BE1c of the first bottom electrode BE1 may be coplanar or continuous with inner surfaces of the recesses RS of the second interlayer dielectric layer 140. In an implementation, the recesses RS of the second interlayer dielectric layer 140 may protrude downwardly toward the substrate 100 from the contact point between the connection surface BE1c and the lateral surface BE1a. The top surface BE1b of the first bottom electrode BE1 may be at a higher level than that of the second top surface 140b of the second interlayer dielectric layer 140 and that of the top surface of the second conductive pattern 142-2. The first bottom electrode BE1 may include a conductive material different from that of the first conductive pattern 142-1. In an implementation, the first bottom electrode BE1 may include a conductive metal nitride (e.g., tantalum nitride).

The second bottom electrode BE2 may be on the first bottom electrode BE1. The second bottom electrode BE2 may directly contact the first bottom electrode BE1 and the magnetic tunnel junction MTJ. The second bottom electrode BE2 may have a width (e.g., in the horizontal direction H) that decreases with increasing distance from the substrate 100 (e.g., in the vertical direction V). The first bottom electrode BE1 and the second bottom electrode BE2 may have the same width at an interface between the first bottom electrode BE1 and the second bottom electrode BE2. In this case, the second bottom electrode BE2 may have a lateral surface coplanar or continuous with the connection surface BE1c of the first bottom electrode BE1. The second bottom electrode BE2 and the magnetic tunnel junction MTJ may have the same width at an interface between the second bottom electrode BE2 and the pinned layer PL of the magnetic tunnel junction MTJ. In this case, the magnetic tunnel junction MTJ may have a lateral surface coplanar or continuous with that of the second bottom electrode BE2. The second bottom electrode BE2 may include a conductive material. In an implementation, the second bottom electrode BE2 may include a conductive metal nitride, e.g., titanium nitride.

The top electrode TE may be on the magnetic tunnel junction MTJ. The top electrode TE may include conductive metal nitrides (titanium nitride, tantalum nitride, etc), transition metals (titanium, tantalum, etc), or rare-earth metals (ruthenium, platinum, etc).

A first protective layer 152 may surround the memory element ME. The first protective layer 152 may cover a lateral surface of the memory element ME. On the first region R1, the first protective layer 152 may cover the lateral surface of the memory element ME. In an implementation, the first protective layer 152 may cover a lateral surface of the top electrode TE, the lateral surface of the magnetic tunnel junction MTJ, the lateral surface of the second bottom electrode BE2, and the connection surface BE1c of the first bottom electrode BE1 that is exposed on or above the second interlayer dielectric layer 140. On or at one side of the memory element ME, the first protective layer 152 may conformally cover the top surface of the second interlayer dielectric layer 140. In an implementation, the first protective layer 152 may extend into the recesses RS and may contact the first top surface 140a of the second interlayer dielectric layer 140. The first protective layer 152 may extend onto the capping layer 150 on the second region R2. The first protective layer 152 may contact a top surface of the capping layer 150. The first protective layer 152 may include silicon nitride.

Figure 6:
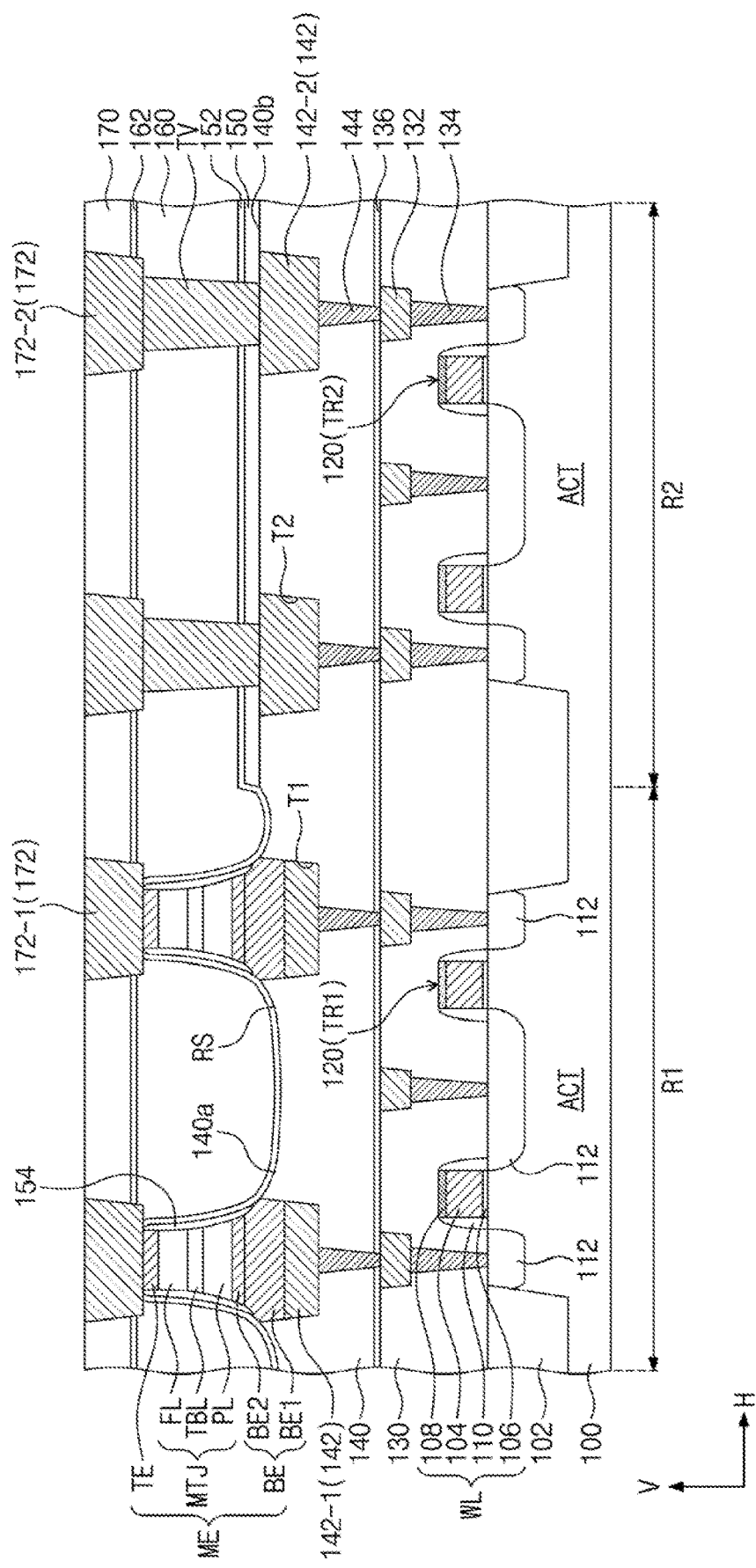
FIG. 6 illustrates a cross-sectional view of a semiconductor device according to some example embodiments.

In an implementation, a second (e.g., inner) protective layer (see 154 of FIG. 6) may further be provided between the memory element ME and the first (e.g., outer) protective layer 152. FIG. 6 illustrates a cross-sectional view of a semiconductor device according to some example embodiments. As shown in FIG. 6, the second protective layer 154 may cover the lateral surface of the top surface TE, the lateral surface of the magnetic tunnel junction MTJ, and the lateral surface of the second bottom electrode BE2. The second protective layer 154 may extend onto the connection surface BE1c of the first bottom electrode BE1 discussed with reference to FIG. 5. In an implementation, on the first bottom electrode BE1, the second protective layer 154 may be on one side of the upper segment BE1-2. The second protective layer 154 may have a bottommost end that is at a higher level than an uppermost end (e.g., end that is distal to the substrate 100 in the vertical direction V) of the lower segment BE1-1 of the first bottom electrode BE1. The second protective layer 154 may include silicon nitride. The following will focus on the embodiment of FIG. 4.

A third interlayer dielectric layer 160 may be on the first protective layer 152. On the first region R1, the third interlayer dielectric layer 160 may surround the memory element ME and may fill the recess RS in which the first protective layer 152 is formed. The first protective layer 152 may have a bottommost end that is at a lower level than that of the second top surface 140b of the second interlayer dielectric layer 140. On the second region R2, the third interlayer dielectric layer 160 may cover the capping layer 150. The third interlayer dielectric layer 160 may include silicon oxide.

On the second region R2, a through electrode TV may be on the second interlayer dielectric layer 140. The through electrode TV may penetrate the third interlayer dielectric layer 160, the first protective layer 152, and the capping layer 150, thereby being coupled to the second conductive pattern 142-2. When the through electrode TV is provided in plural, the plurality of through electrodes TV may have island shapes that are two-dimensionally arranged. Each of the through electrodes TV may have a width that increases with increasing distance (in the vertical direction V) from the substrate 100. The through electrode TV may include a conductive material, such as copper.

The third interlayer dielectric layer 160 may be provided thereon with a second etch stop layer 162 that includes silicon nitride or silicon carbonitride. The third interlayer dielectric layer 160 and the second etch stop layer 162 may be collectively defined as an upper dielectric layer.

A fourth interlayer dielectric layer 170 may be on the second etch stop layer 162. The fourth interlayer dielectric layer 170 may include silicon oxide, silicon nitride, or silicon oxynitride.

At least one upper conductive pattern 172 may be in the fourth interlayer dielectric layer 170. The upper conductive pattern 172 may include a first upper conductive pattern 172-1 on the first region R1 and a second upper conductive pattern 172-2 on the second region R2. The first and second upper conductive patterns 172-1 and 172-2 may be at the same level from or relative to the substrate 100. In an implementation, a distance (in the vertical direction V) between the first conductive pattern 142-1 and the first upper conductive pattern 172-1 may be the same as that between the second conductive pattern 142-2 and the second upper conductive pattern 172-2.

The first upper conductive pattern 172-1 may be electrically connected to the memory element ME. In an implementation, the first upper conductive pattern 172-1 may be on the third interlayer dielectric layer 160, and when viewed in plan, may overlap the memory element ME. The first upper conductive pattern 172-1 may contact the top electrode TE of the memory element ME. In addition, the first upper conductive pattern 172-1 may be connected to the first transistor TR1 through the memory element ME and the first conductive pattern 142-1. The first upper conductive pattern 172-1 may include copper (Cu).

The second upper conductive pattern 172-2 may be electrically connected to the through electrode TV. In an implementation, the second upper conductive pattern 172-2 may be on the third interlayer dielectric layer 160, and when viewed in plan, may overlap the through electrode TV. The second upper conductive pattern 172-2 may contact the through electrode TV. The second upper conductive pattern 172-2 may be electrically connected via the through electrode TV to the second transistor TR2. The second upper conductive pattern 172-2 may include copper (Cu).

The fourth interlayer dielectric layer 170 may bury the upper conductive pattern 172. In an implementation, the upper conductive pattern 172 may penetrate the fourth interlayer dielectric layer 170 and the second etch stop layer 162, thereby contacting the memory element ME or the through electrode TV. The upper conductive pattern 172 may have a lower portion that extends into the third interlayer dielectric layer 160. In an implementation, the upper conductive pattern 172 may have a bottom (e.g., substrate 100-facing) surface at a lower level than that of a top surface of the third interlayer dielectric layer 160.

A semiconductor device may be provided as discussed above.

In an implementation, no contact may be separately provided between the memory element ME and the first conductive pattern 142-1, and the bottom electrode BE of the memory element ME may directly contact the first conductive pattern 142-1. Therefore, there may be no need for a separate space in which is disposed a contact between the memory element ME and the second lower conductive pattern 142, and thus a small spacing may be provided between the upper conductive pattern 172 and the second lower conductive pattern 142. Accordingly, it may be possible to provide a compact-sized semiconductor device.

Figure 7:
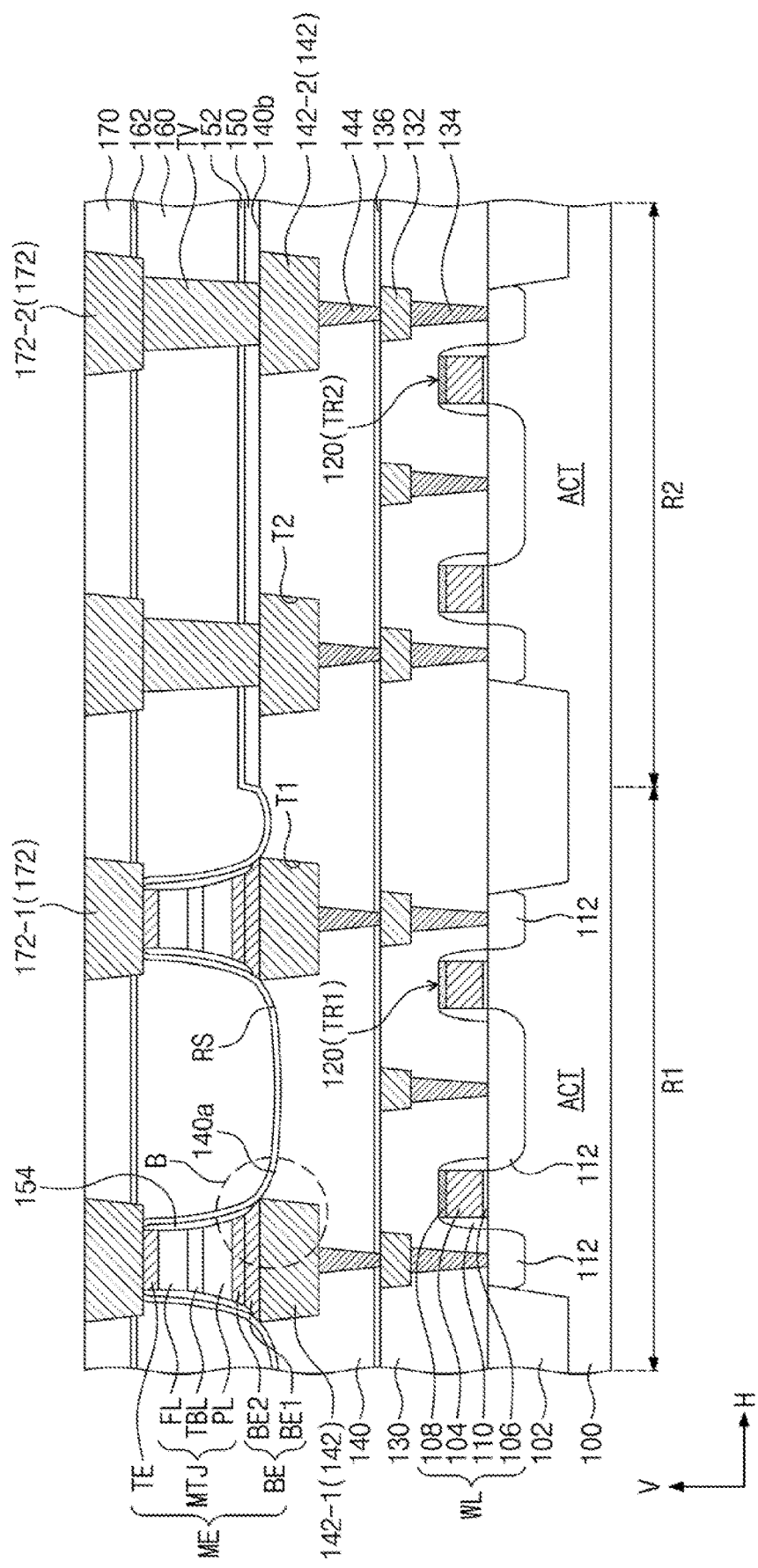
FIG. 7 illustrates a cross-sectional view of a semiconductor device according to some example embodiments.

FIG. 7 illustrates a cross-sectional view of a semiconductor device according to some example embodiments. In the embodiment that follows, a detailed description of technical features repetitive to those discussed above with reference to FIGS. 4 to 6 may be omitted, and a difference thereof will be explained in detail. The same reference numerals may be allocated to the same components as those discussed in the semiconductor device according to some example embodiments.

Referring to FIG. 7, a substrate 100 may be provided. The substrate 100 may have a first region R1 and a second region R2. The substrate 100 may be provided thereon with integrated transistors 120. The transistors 120 may include first transistors TR1 on the first region R1 and second transistors TR2 on the second region R2. The first transistor TR1 may be the selection element of the memory structure MS discussed with reference to FIG. 1. The second transistor TR2 may be the memory peripheral circuit for driving the memory cells and/or the logic circuit of the logic structure LS discussed with reference to FIG. 1.

The substrate 100 may be provided thereon with a first interlayer dielectric layer 130 that covers the transistors 120.

A plurality of first lower conductive patterns 132 may be in the first interlayer dielectric layer 130. The first lower conductive patterns 132 may be coupled to impurity regions 112 through first contact plugs 134 that penetrate the first interlayer dielectric layer 130.

A first etch stop layer 136 and a second interlayer dielectric layer 140 may be sequentially on the first interlayer dielectric layer 130.

A plurality of second lower conductive patterns 142 may be in the second interlayer dielectric layer 140. The second lower conductive patterns 142 may be coupled to corresponding first lower conductive patterns 132 through second contact plugs 144 that penetrate the second interlayer dielectric layer 140 and the first etch stop layer 136. The second lower conductive patterns 142 and the second contact plugs 144 may include the same material as that of the first lower conductive patterns 132. In an implementation, the second lower conductive patterns 142 and the second contact plugs 144 may include copper.

The second lower conductive patterns 142 may include first conductive patterns 142-1 on the first region R1 and second conductive patterns 142-2 on the second region R2. The first conductive pattern 142-1 may be connected to the first transistor TR1, and the second conductive pattern 142-2 may be connected to the second transistor TR2. On the first region R1, the first conductive pattern 142-1 may have a top surface at substantially the same level as that of a top surface of the second interlayer dielectric layer 140. On the second region R2, the second conductive pattern 142-2 may have a top surface at substantially the same level as that of the top surface of the second interlayer dielectric layer 140. In an implementation, the second interlayer dielectric layer 140 on the first region R1 may have first trenches T1 that protrude downwardly toward the substrate 100 from the top surface of the second interlayer dielectric layer 140, and the second interlayer dielectric layer 140 on the second region R2 may have second trenches T2 that protrude downwardly toward the substrate 100 from the top surface of the second interlayer dielectric layer 140. The first conductive patterns 142-1 on the first region R1 may completely fill the first trenches T1. The second conductive patterns 142-2 on the second region R2 may completely fill the second trenches T2.

The second interlayer dielectric layer 140 on the second region R2 may have a second top surface 140b that is flat, and the second interlayer dielectric layer 140 on the first region R1 may have a first top surface 140a that is curved toward the substrate 100. The first top surface 140a may have a shape that is recessed downwardly from the second top surface 140b. In an implementation, the second interlayer dielectric layer 140 may have recesses RS that protrude toward the substrate 100 from the top surface of the second interlayer dielectric layer 140. On the first region R1, the recesses RS may be positioned adjacent to the first trenches T1.

A capping layer 150 may be on the second interlayer dielectric layer 140. The capping layer 150 may cover the second interlayer dielectric layer 140 on the second region R2 and may expose the second interlayer dielectric layer 140 on the first region R1.

A memory element ME may be on the substrate 100. The memory element ME may be on the first region R1 of the substrate 100. The memory element ME may be on the second interlayer dielectric layer 140. Each of the memory elements ME may have a width that decreases with increasing distance from the substrate 100.

The memory element ME may be a magnetic memory device including a magnetic tunnel junction MTJ. The magnetic tunnel junction MTJ may include a pinned layer PL, a free layer FL, and a tunnel barrier layer TBL between the pinned layer PL and the free layer FL. The magnetic tunnel junction MTJ may have its electrical resistance that is changed depending on magnetization directions of the pinned layer PL and the free layer FL. The pinned layer PL, the tunnel barrier layer TBL, and the free layer FL may be the same as or similar to those discussed with reference to FIG. 3.

The memory element ME may further include a bottom electrode BE and a top electrode TE. The magnetic tunnel junction MTJ may be between the bottom electrode BE and the top electrode TE. In an implementation, the bottom electrode BE may be between the first conductive pattern 142-1 and the magnetic tunnel junction MTJ, and the top electrode TE may be on the magnetic tunnel junction MTJ.

Figure 8:
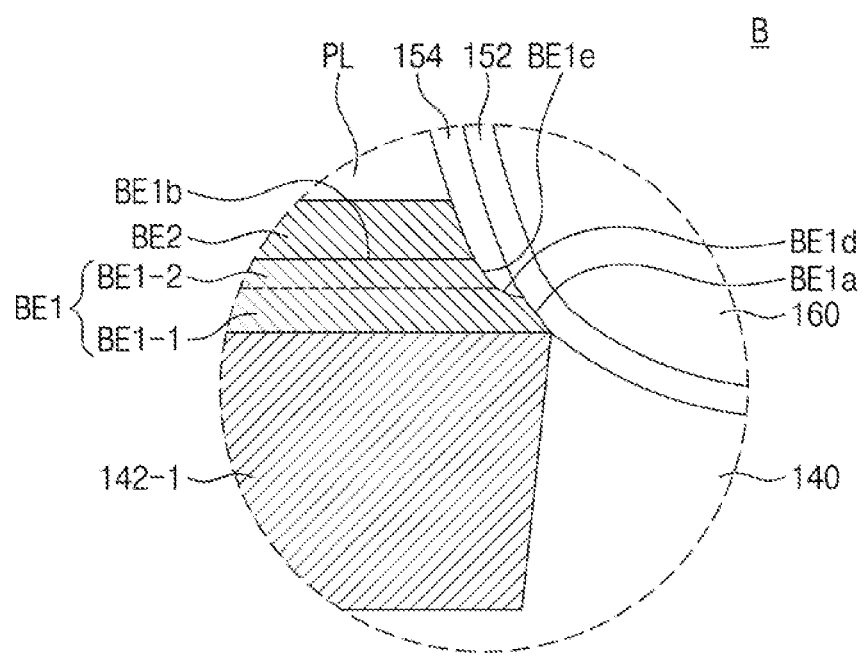
FIG. 8 illustrates an enlarged view of section B of FIG. 7.

The bottom electrode BE may include a first bottom electrode BE1 and a second bottom electrode BE2 on the first bottom electrode BE1. FIG. 8 illustrates an enlarged view of section B of FIG. 7.

Referring to FIGS. 7 and 8, the first bottom electrode BE1 may be on the first conductive pattern 142-1 of the second lower conductive pattern 142. The first bottom electrode BE1 may directly contact the first conductive pattern 142-1. At an interface between the first bottom electrode BE1 and the first conductive pattern 142-1, the first bottom electrode BE1 may have a width the same as or greater than that of the first conductive pattern 142-1. The width of the first bottom electrode BE1 may decrease with increasing distance from the substrate 100. The first bottom electrode BE1 may protrude from the top surface of the second interlayer dielectric layer 140. In an implementation, the first bottom electrode BE1 may be at a higher level than that of the top surface of the second interlayer dielectric layer 140.

The first bottom electrode BE1 may have a lower segment BE1-1 in contact with the first conductive pattern 142-1, and may also have an upper segment BE1-2 on the lower segment BE1-1 and in contact with the second bottom electrode BE2. The upper segment BE1-2 may have a width less than that of the lower segment BE1-1. In an implementation, the first bottom electrode BE1 may have a stepped lateral surface. In an implementation, the lower segment BE1-1 of the first bottom electrode BE1 may have a top surface BE1d exposed by the upper segment BE1-2, and the upper segment BE1-2 may have a lateral surface BE1e whose shape is recessed from the lateral surface BE1a of the lower segment BE1-1. In this case, the first bottom electrode BE1 may have an uneven lateral surface whose center protrudes upwardly. The first bottom electrode BE1 may include a conductive material different from that of the first conductive pattern 142-1. In an implementation, the first bottom electrode BE1 may include a conductive metal nitride (e.g., tantalum nitride).

The second bottom electrode BE2 may be on the first bottom electrode BE1. The second bottom electrode BE2 may directly contact the first bottom electrode BE1 and the magnetic tunnel junction MTJ. The second bottom electrode BE2 may have a width that decreases with increasing distance from the substrate 100. The second bottom electrode BE2 and the upper segment BE1-2 of the first bottom electrode BE1 may have the same width at an interface between the second bottom electrode BE2 and the first bottom electrode BE1. In this case, the second bottom electrode BE2 may have a lateral surface coplanar or continuous with the lateral surface BE1e of the upper segment BE1-2 of the first bottom electrode BE1. The second bottom electrode BE2 and the magnetic tunnel junction MTJ may have the same width at an interface between the second bottom electrode BE2 and the pinned layer PL of the magnetic tunnel junction MTJ. The magnetic tunnel junction MTJ may have a lateral surface coplanar or continuous with that of the second bottom electrode BE2. The second bottom electrode BE2 may include a conductive material. In an implementation, the second bottom electrode BE2 may include conductive metal nitride (e.g., titanium nitride).

In an implementation, the bottom electrode BE of the memory element ME may directly contact the first conductive pattern 142-1. A small interval may be between the second lower conductive pattern 142 and an upper conductive pattern 172 which is discussed below, and a semiconductor device may be provided to have a compact size.

The top electrode TE may be on the magnetic tunnel junction MTJ. The top electrode TE may include conductive metal nitrides (titanium nitride, tantalum nitride, etc), transition metals (titanium, tantalum, etc), or rare-earth metals (ruthenium, platinum, etc).

A third protective layer 154 may be on a lateral surface of the memory element ME. The third protective layer 154 may be substantially the same as the second protective layer 154 discussed with reference to FIG. 6, and the same reference numeral may be allocated thereto. The third protective layer 154 may cover a lateral surface of the top electrode TE, the lateral surface of the magnetic tunnel junction MTJ, and the lateral surface of the second bottom electrode BE2. The third protective layer 154 may extend onto the lateral surface BE1e of the upper segment BE1-2 of the first bottom electrode BE1, thereby contacting the top surface BE1d of the lower segment BE1-1 of the first bottom electrode BE1. The third protective layer 154 may have an outer surface coplanar or continuous with the lateral surface BE1a of the lower segment BE1-1 of the first bottom electrode BE1. The third protective layer 154 may include silicon nitride.

A first protective layer 152 may surround the memory element ME. The first protective layer 152 may cover the lateral surface of the memory element ME. On the first region R1, the first protective layer 152 may cover the outer surface of the third protective layer 154 and the lateral surface BE1a of the lower segment BE1-1 of the first bottom electrode BE1. On one side of the memory element ME, the first protective layer 152 may conformally cover the top surface of the second interlayer dielectric layer 140. In an implementation, the first protective layer 152 may extend into the recesses RS and may contact the first top surface 140a of the second interlayer dielectric layer 140. The first protective layer 152 may extend onto the capping layer 150 on the second region R2. The first protective layer 152 may contact a top surface of the capping layer 150. The first protective layer 152 may include silicon nitride.

In an implementation, the third protective layer 154 may be further included, in addition to the first protective layer 152 covering the lateral surface of the memory element ME, and the magnetic tunnel junction MTJ may be prevented from being contaminated in a process where the bottom electrode BE is formed. This will be further discussed in detail in connection with a method of fabricating a semiconductor device.

A third interlayer dielectric layer 160 may be on the first protective layer 152. On the first region R1, the third interlayer dielectric layer 160 may surround the memory element ME, and may fill the recess RS in which the first protective layer 152 is formed. The third interlayer dielectric layer 160 may include silicon oxide.

On the second region R2, a through electrode TV may be on the second interlayer dielectric layer 140. The through electrode TV may penetrate the third interlayer dielectric layer 160, the first protective layer 152, and the capping layer 150, thereby being coupled to the second conductive pattern 142-2. The through electrode TV may include a conductive material, such as copper.

The third interlayer dielectric layer 160 may be provided thereon with a second etch stop layer 162 that includes silicon nitride or silicon carbonitride. The third interlayer dielectric layer 160 and the second etch stop layer 162 may be collectively defined as an upper dielectric layer.

A fourth interlayer dielectric layer 170 may be on the second etch stop layer 162. The fourth interlayer dielectric layer 170 may include silicon oxide, silicon nitride, or silicon oxynitride.

At least one upper conductive pattern 172 may be in the fourth interlayer dielectric layer 170. The upper conductive pattern 172 may include a first upper conductive pattern 172-1 on the first region R1 and a second upper conductive pattern 172-2 on the second region R2. The first and second upper conductive patterns 172-1 and 172-2 may be at the same level from the substrate 100.

The first upper conductive pattern 172-1 may be electrically connected to the memory element ME. The first upper conductive pattern 172-1 may contact the top electrode TE of the memory element ME. In addition, the first upper conductive pattern 172-1 may be connected to the first transistor TR1 through the memory element ME and the first conductive pattern 142-1. The first upper conductive pattern 172-1 may include copper (Cu).

The second upper conductive pattern 172-2 may be electrically connected to the through electrode TV. The second upper conductive pattern 172-2 may contact the through electrode TV. The second upper conductive pattern 172-2 may be electrically connected via the through electrode TV to the second transistor TR2. The second upper conductive pattern 172-2 may include copper (Cu).

The fourth interlayer dielectric layer 170 may bury the upper conductive pattern 172. In an implementation, the upper conductive pattern 172 may penetrate the fourth interlayer dielectric layer 170 and the second etch stop layer 162, thereby contacting the memory element ME or the through electrode TV.

A semiconductor device may be provided as discussed above.

FIGS. 9 to 17 illustrate cross-sectional views of a method of fabricating a semiconductor device according to some example embodiments.

Figure 9:
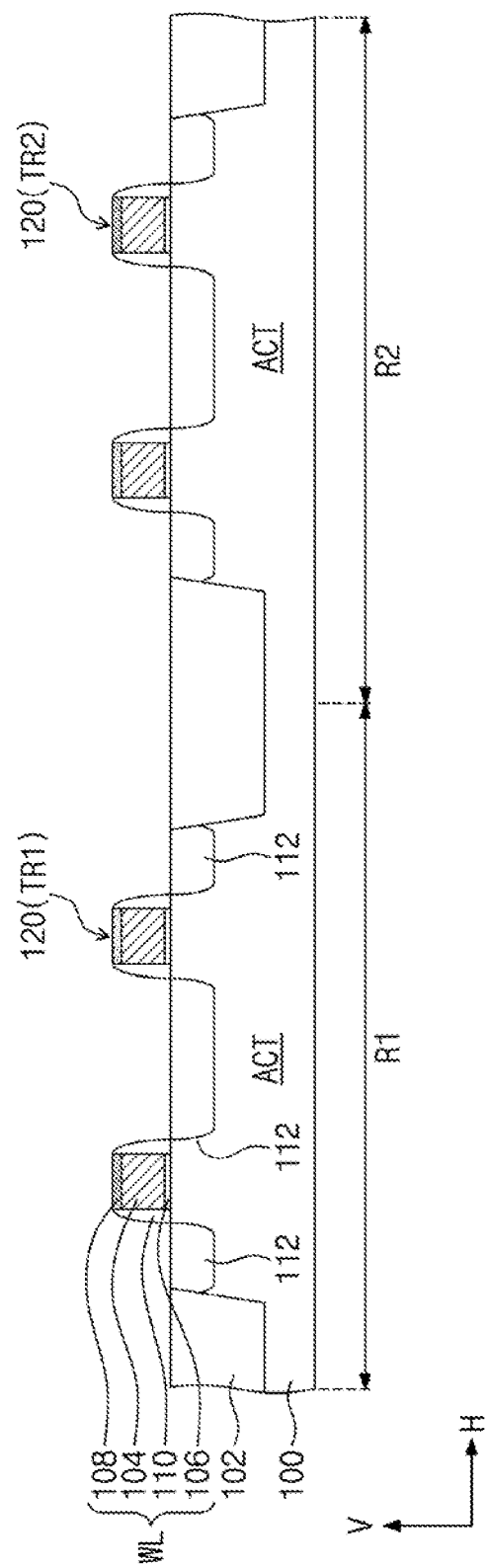
FIGS. 9 to 17 illustrate cross-sectional views of stages in a method of fabricating a semiconductor device according to some example embodiments.

Referring to FIG. 9, a substrate 100 may be prepared. The substrate 100 may be a silicon substrate, a silicon-germanium substrate, a germanium substrate, or a single-crystalline epitaxial layer grown on a single-crystalline silicon substrate. The substrate 100 may have a first region R1 and a second region R2. The first region R1 and the second region R2 may be horizontally spaced apart from each other. The first region R1 may be a portion of an area on which is formed the memory structure MS of FIG. 1, and the second region R2 may be a portion of an area on which is formed the logic structure LS of FIG. 1.

Transistors 120 may be formed on the substrate 100. The substrate 100 may undergo an etching process to form a trench, and then the trench may be filled with a dielectric material to form a device isolation layer 102 that defines active regions ACT. The transistors 120 may be formed on the active regions ACT of the substrate 100. The formation of the transistors 120 may include sequentially forming a gate dielectric layer 106, a gate electrode 104, and a gate mask pattern 108 on the substrate 100, and forming impurity regions 112 by implanting impurities into the substrate 100 on opposite sides of the gate electrode 104. The transistors 120 may include first transistors TR1 formed on the first region R1 and second transistors TR2 formed on the second region R2. Gate spacers 110 may be formed on sidewalls of the gate electrode 104. The first transistor TR1 formed on the first region R1 may be the selection element of the memory structure MS discussed with reference to FIG. 2, and the second transistor TR2 formed on the second region R2 may be the memory peripheral circuit for driving the memory cells and/or the logic circuit of the logic structure LS discussed with reference to FIG. 2.

Figure 10:
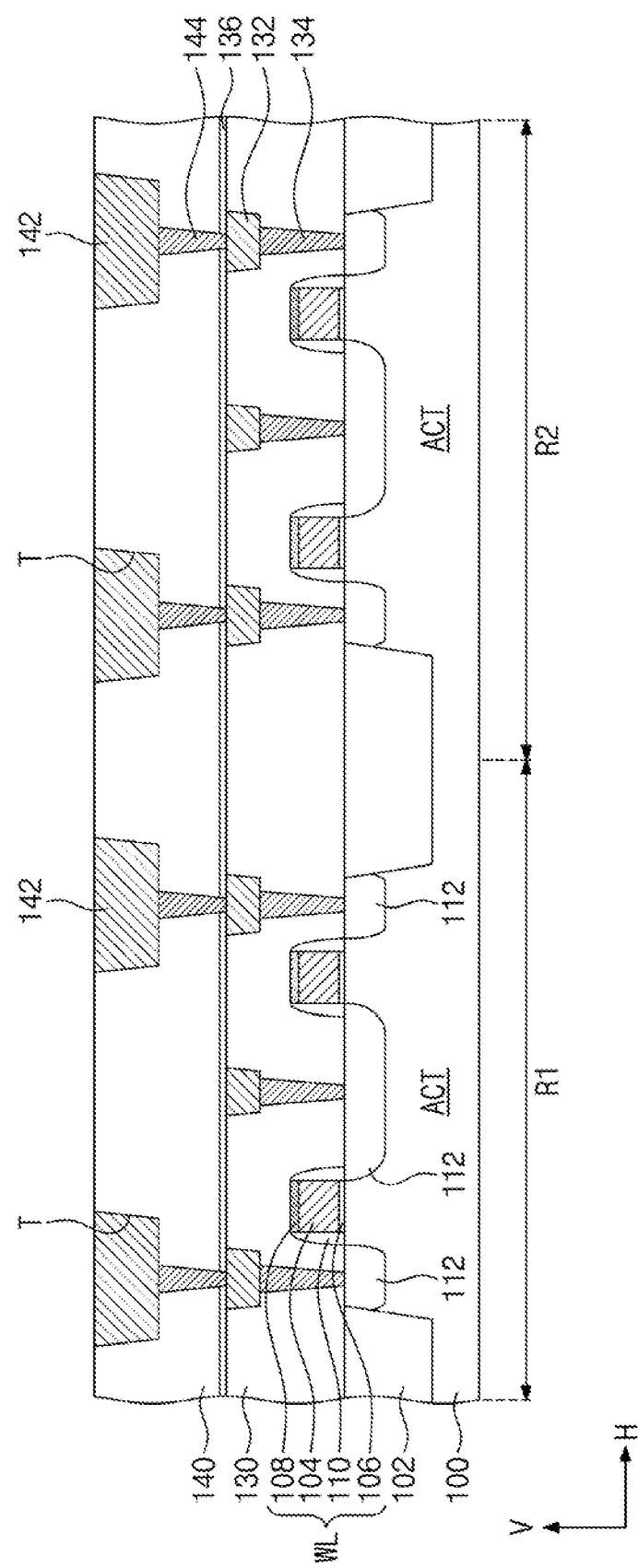

Referring to FIG. 10, a lower dielectric layer may be formed on the substrate 100 of the first and second regions R1 and R2. The lower dielectric layer may include a first interlayer dielectric layer 130, a first etch stop layer 136, and a second interlayer dielectric layer 140 that are sequentially stacked on the substrate 100. A first lower connection structure may be formed in the first interlayer dielectric layer 130. For example, the first lower connection structure may include first lower conductive patterns 132 and first contact plugs 134. The first lower conductive patterns 132 and the first contact plugs 134 may be the same as those discussed with reference to FIG. 4, and a repeated detailed description thereof may be omitted.

A second lower connection structure may be formed in the second interlayer dielectric layer 140. The second lower connection structure may include second lower conductive patterns 142 and second contact plugs 144. The second lower conductive patterns 142 may be formed by forming trenches T in an upper portion of the second interlayer dielectric layer 140, and then filling the trenches T with a conductive material. The conductive material may include copper. The second lower conductive patterns 142 may have their top surfaces at substantially the same level as that of a top surface of the second interlayer dielectric layer 140. In an implementation, the top surfaces of the second lower conductive patterns 142 may be coplanar with the top surface of the second interlayer dielectric layer 140. On the first and second regions R1 and R2, the second lower conductive patterns 142 may be connected to corresponding ones of the first and second transistors TR1 and TR2 through the second contact plugs 144, the first lower conductive patterns 132, and the first contact plugs 134.

Figure 11:
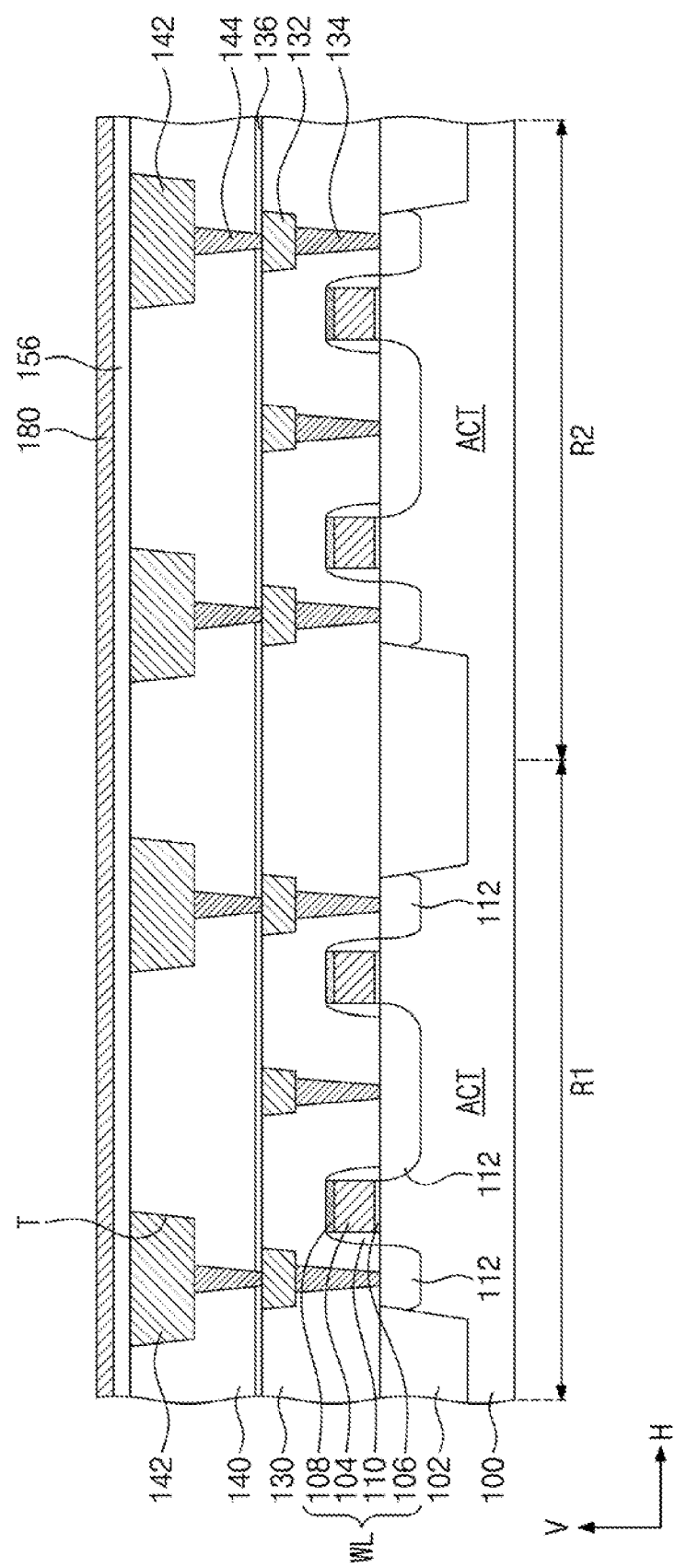

Referring to FIG. 11, a preliminary capping layer 156 and a preliminary dummy layer 180 may be formed on the second interlayer dielectric layer 140. In an implementation, on the first and second regions R1 and R2, the preliminary capping layer 156 may cover the top surface of the second interlayer dielectric layer 140 and the top surfaces of the second lower conductive patterns 142. The preliminary capping layer 156 may be formed by depositing or coating a dielectric material on the second interlayer dielectric layer 140. The dielectric material may include silicon nitride or silicon carbonitride. The preliminary dummy layer 180 may be formed by depositing a conductive material on the preliminary capping layer 156. The conductive material may include conductive metal nitride (e.g., titanium nitride or tantalum nitride).

Figure 12:
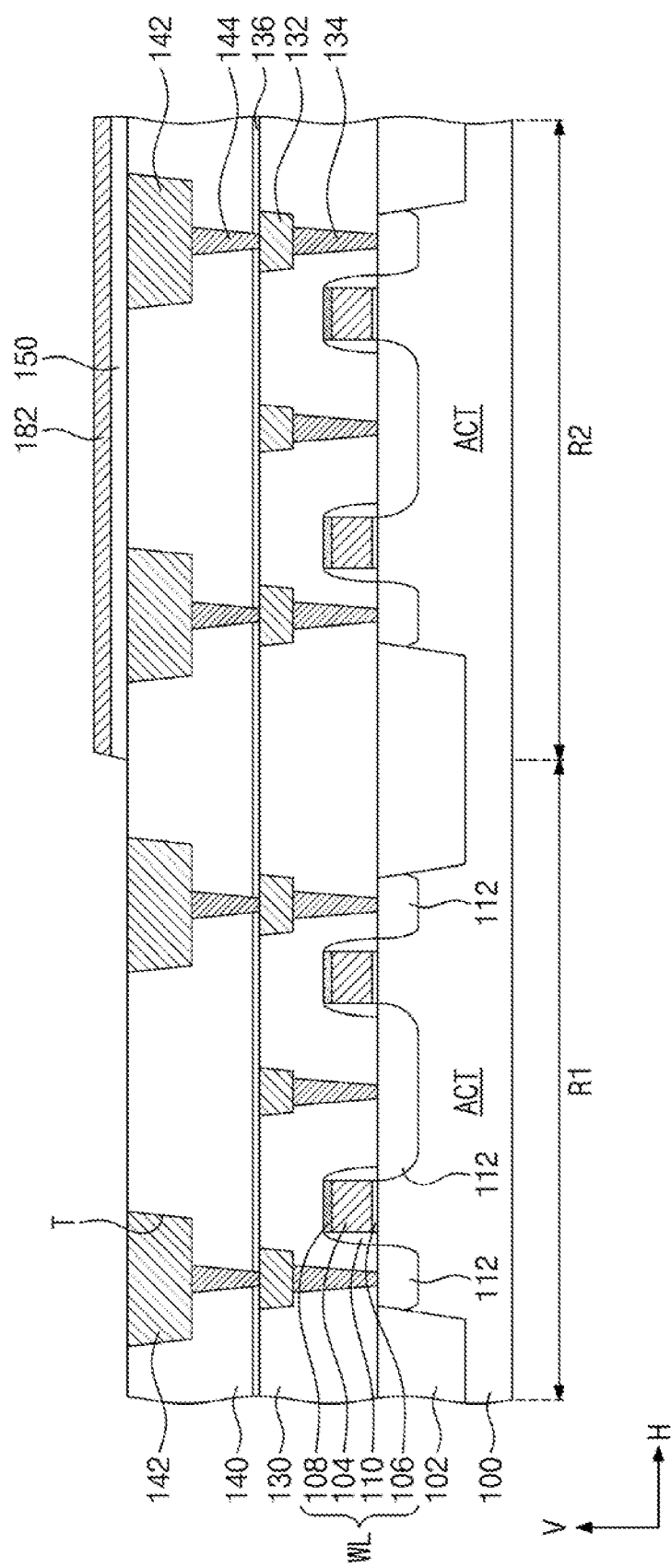

Referring to FIG. 12, the preliminary capping layer 156 and the preliminary dummy layer 180 may be removed from the first region R1. The preliminary capping layer 156 may be etched to form a capping layer 150 that covers the second interlayer dielectric layer 140 on the second region R2. The preliminary dummy layer 180 may be etched to form a dummy layer 182 that covers the capping layer 150 on the second region R2. The capping layer 150 and the dummy layer 182 may cover the second region R2 without covering the first region R1. Therefore, the top surface of the second interlayer dielectric layer 140 and the top surfaces of the second lower conductive patterns 142 may be exposed on the first region R1.

Figure 13:
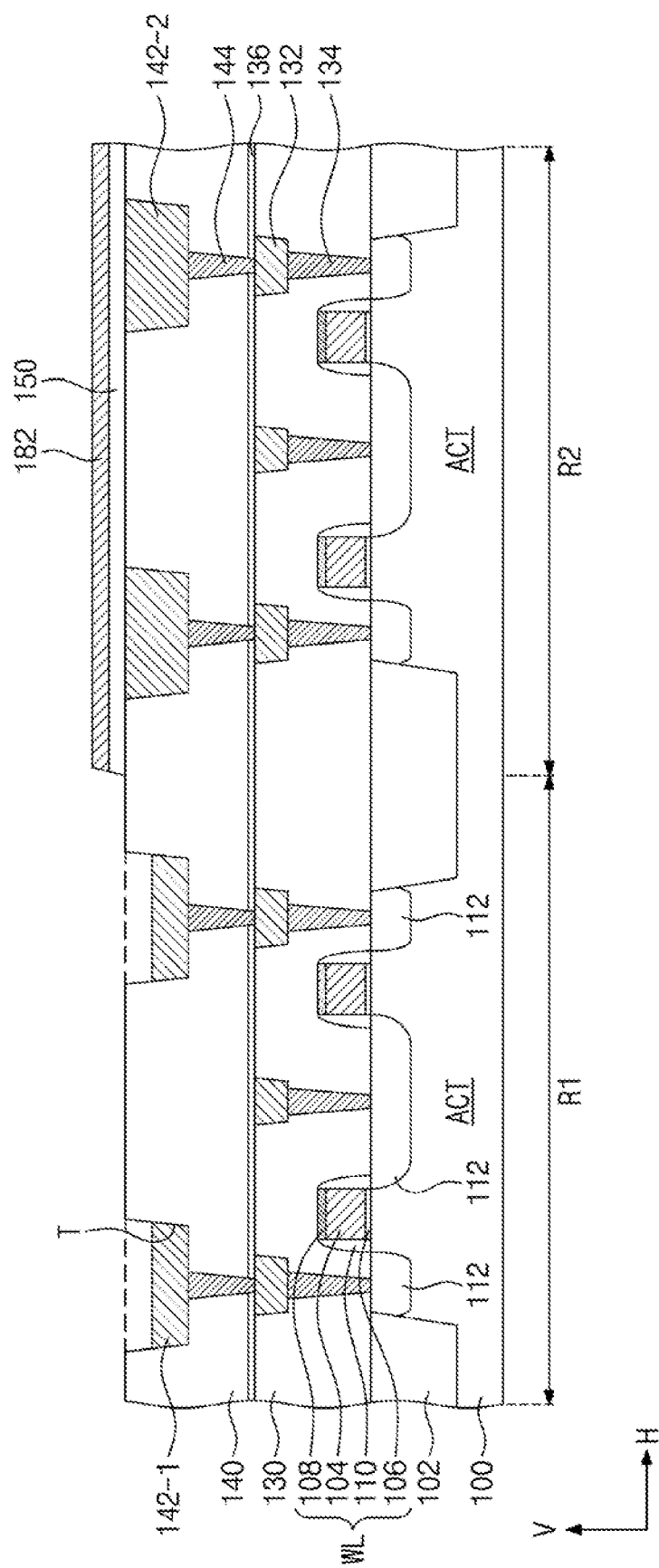

Referring to FIG. 13, the second lower conductive pattern 142 may be partially removed from the first region R1. In an implementation, an etching process may be performed on the second lower conductive pattern 142 on the first region R1. In an implementation, on the first region R1, an upper portion of the second lower conductive pattern 142 may be etched to form a first conductive pattern 142-1. The first conductive pattern 142-1 may remain in a lower portion of the trench T in the second interlayer dielectric layer 140, and the trench T may thus have an empty upper portion. The second lower conductive pattern 142 on the second region R2 may be the second conductive pattern 142-2 discussed with reference to FIG. 4. The etching process may cause the first conductive pattern 142-1 to have a top surface at a lower level than that the top surface of the second interlayer dielectric layer 140 and that of a top surface of the second conductive pattern 142-2.

Figure 14:
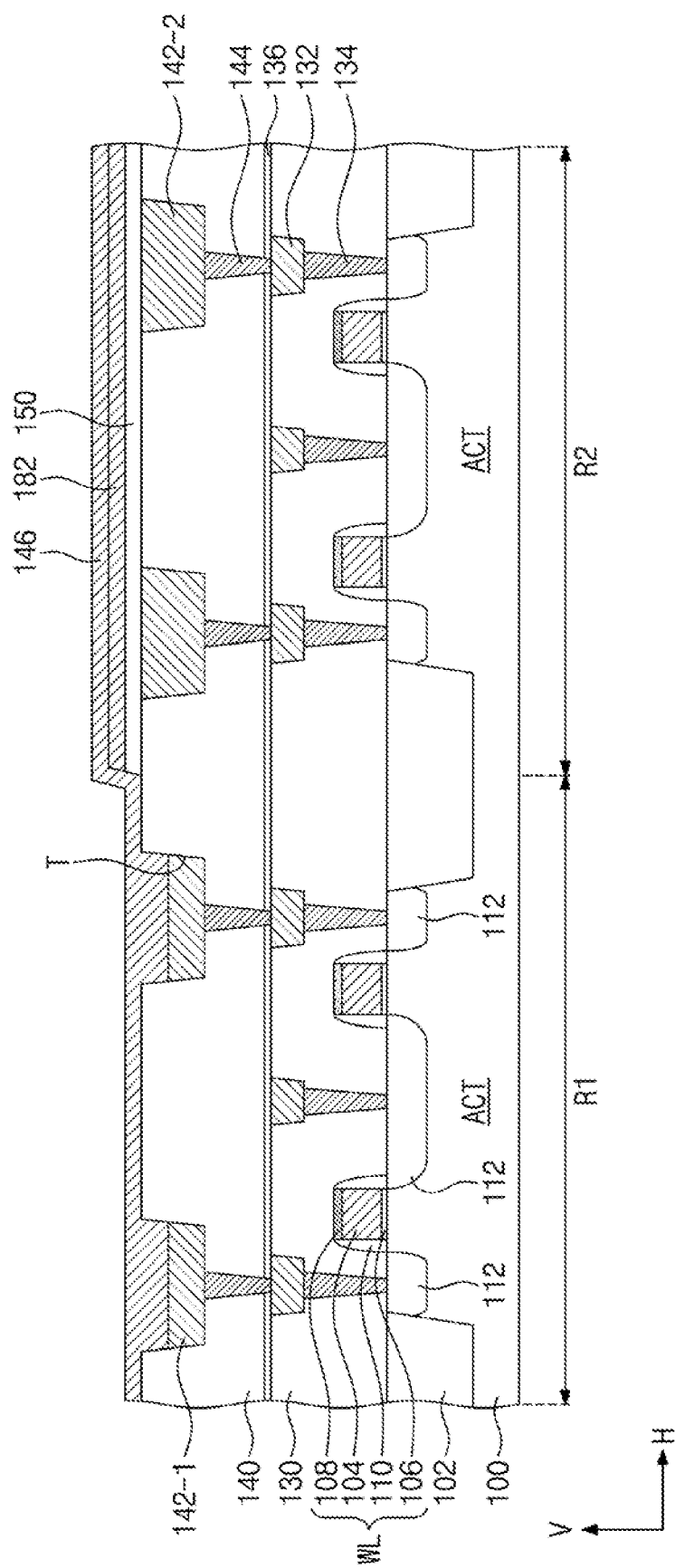

Referring to FIG. 14, a metal layer 146 may be formed on the second interlayer dielectric layer 140. The metal layer 146 may be formed by depositing a conductive material on the second interlayer dielectric layer 140. The conductive material may cover the second interlayer dielectric layer 140 on the first region R1, and may fill a remaining portion of the trench T. In an implementation, the metal layer 146 may contact the first conductive pattern 142-1 in the trench T on the first region R1. The conductive material may cover a top surface of the dummy layer 182 on the second region R2. The conductive material may include conductive metal nitride (e.g., tantalum nitride). The second interlayer dielectric layer 140 may include a different material from that of the dummy layer 182. In an implementation, the second interlayer dielectric layer 140 may include the same material as that of the dummy layer 182, and in this case, the second interlayer dielectric layer 140 and the dummy layer 182 may constitute a single unitary body.

Figure 15:
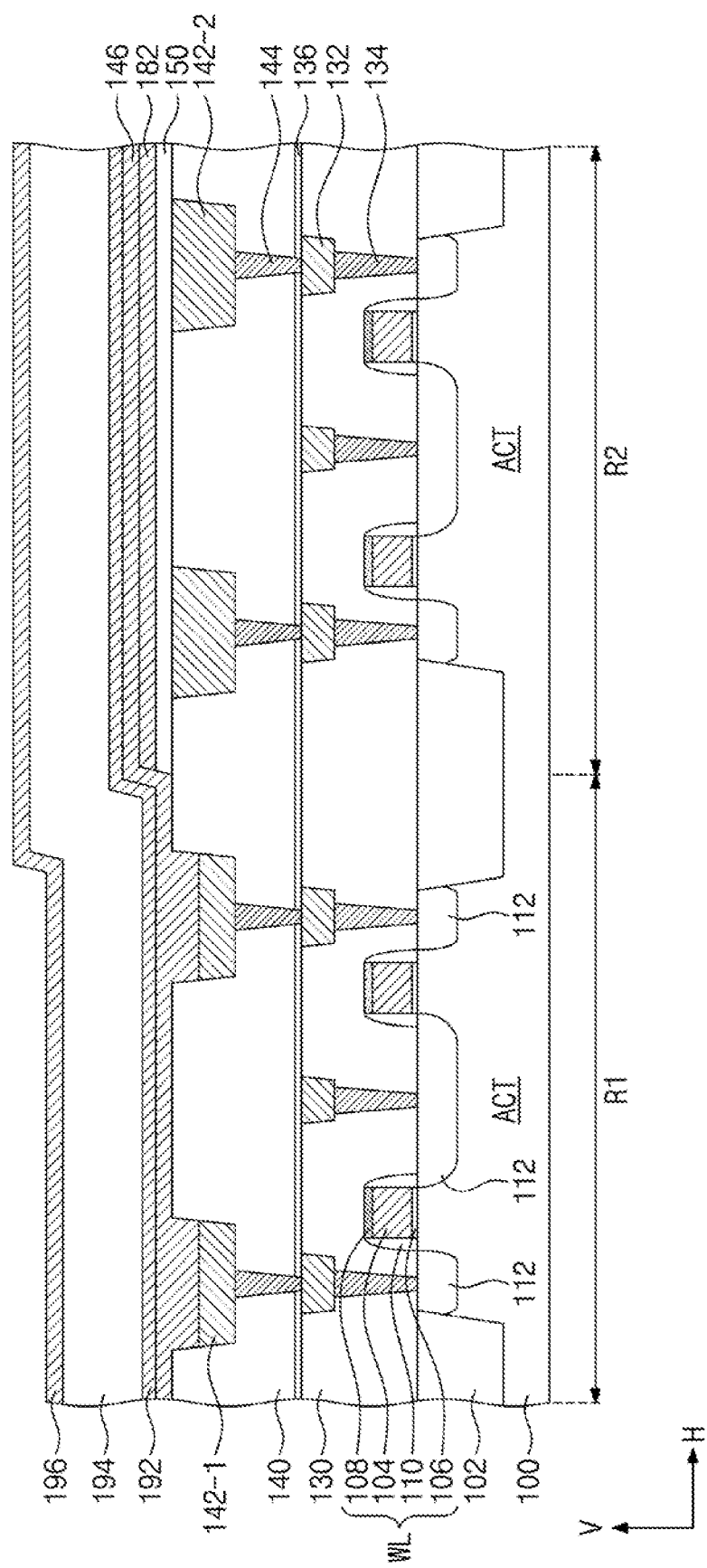

Referring to FIG. 15, a bottom electrode layer 192, a magnetic tunnel junction layer 194, and a top electrode layer 196 may be sequentially formed on the metal layer 146. In an implementation, the magnetic tunnel junction layer 194 may include a pinned layer, a tunnel barrier layer, and a free layer that are sequentially stacked on the bottom electrode layer 192. The bottom electrode layer 192, the pinned layer, the tunnel barrier layer, the free layer, and the top electrode layer 196 may be formed of the same material as that of the second bottom electrode BE2, the pinned layer PL, the tunnel barrier layer TBL, the free layer FL, and the top electrode TE, respectively, discussed with reference to FIG. 4.

Figure 16:
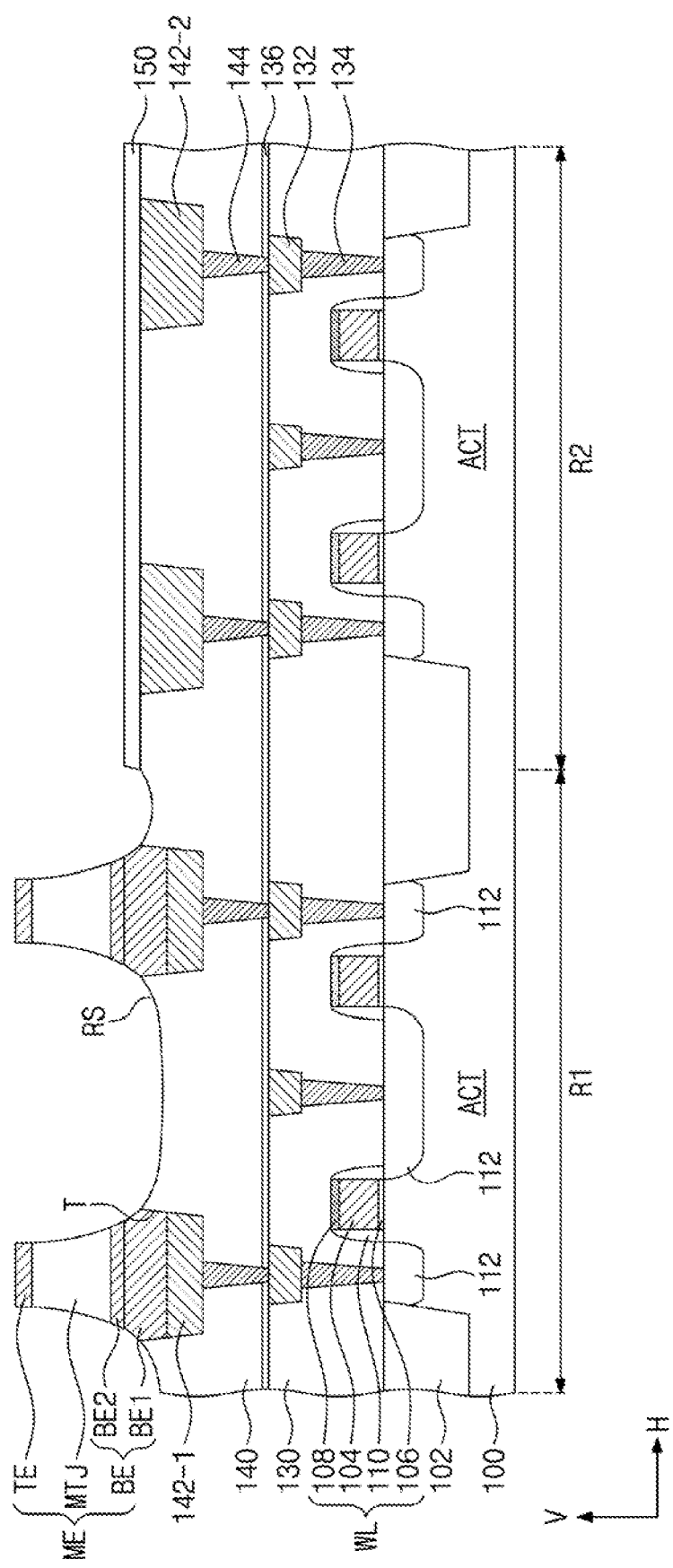

Referring to FIG. 16, a patterning process may be performed on the bottom electrode layer 192, the magnetic tunnel junction layer 194, and the top electrode layer 196. The patterning process may be executed such that the bottom electrode layer 192, the magnetic tunnel junction layer 194, and the top electrode layer 196 are etched to respectively form a second bottom electrode BE2, a magnetic tunnel junction MTJ, and a top electrode TE. The patterning process may include forming a mask pattern on the top electrode layer 196, and performing an etching process that uses the mask pattern as an etching mask. The etching process may include, e.g., an ion beam etching process. The etching process may also etch the metal layer 146. In an implementation, the metal layer 146 may be patterned to form a first bottom electrode BE1 that remains below the second bottom electrode BE2. In an implementation, on one side of the second bottom electrode BE2, the metal layer 146 may be removed from the top surface of the second interlayer dielectric layer 140, and the second bottom electrode BE2 may have a remaining metal layer 146 therebelow. A memory element ME may be constituted by the first bottom electrode BE1, the second bottom electrode BE2, the magnetic tunnel junction MTJ, and the top electrode TE. The first bottom electrode BE1 may have a lower segment in the trench T and an upper segment on the lower segment. During the etching process performed on the metal layer 146 on the first region R1, the metal layer 146 may be removed from the second region R2. A difference in pattern density between the first region R1 and the second region R2 may cause the metal layer 146 to be etched deeper on the second region R2 than on the first region R1.

In an implementation, the dummy layer 182 may be below the metal layer 146 on the second region R2, and neither the capping layer 150 nor the second conductive pattern 142-2 may be etched during the etching process. In this case, the dummy layer 182 may serve as an etch stop layer to protect components on the second region R2 during the etching process, and the occurrence of failure may be reduced in fabrication of a semiconductor device.

During the etching process, the dummy layer 182 may be etched to expose a top surface of the capping layer 150. In an implementation, the dummy layer 182 may partially remain without being completely removed.

In an ion beam etching process, the second interlayer dielectric layer 140 including a dielectric material may be etched at an etch rate greater than that at which is removed the metal layer 146 including a metallic material. Therefore, during the formation of the memory element ME, the second interlayer dielectric layer 140 may be etched at its upper portion exposed by the memory element ME, with the result that a recess RS may be formed on the first region R1. The second interlayer dielectric layer 140 may then have a recessed top surface on the first region R1 and a substantially flat top surface on the second region R2. In this case, a bottommost end of the recess RS may be located at a higher level than that of the top surface of the first conductive pattern 142-1, and the recess RS may be spaced apart from the first conductive pattern 142-1.

In an implementation, the first conductive pattern 142-1 may be formed to have a top surface lower than that of the second interlayer dielectric layer 140, and the first conductive pattern 142-1 may not be etched during the etching process. Accordingly, during the etching process, the memory element ME may be prevented from being contaminated due to an etch byproduct produced from the first conductive pattern 142-1 including copper.

Figure 17:
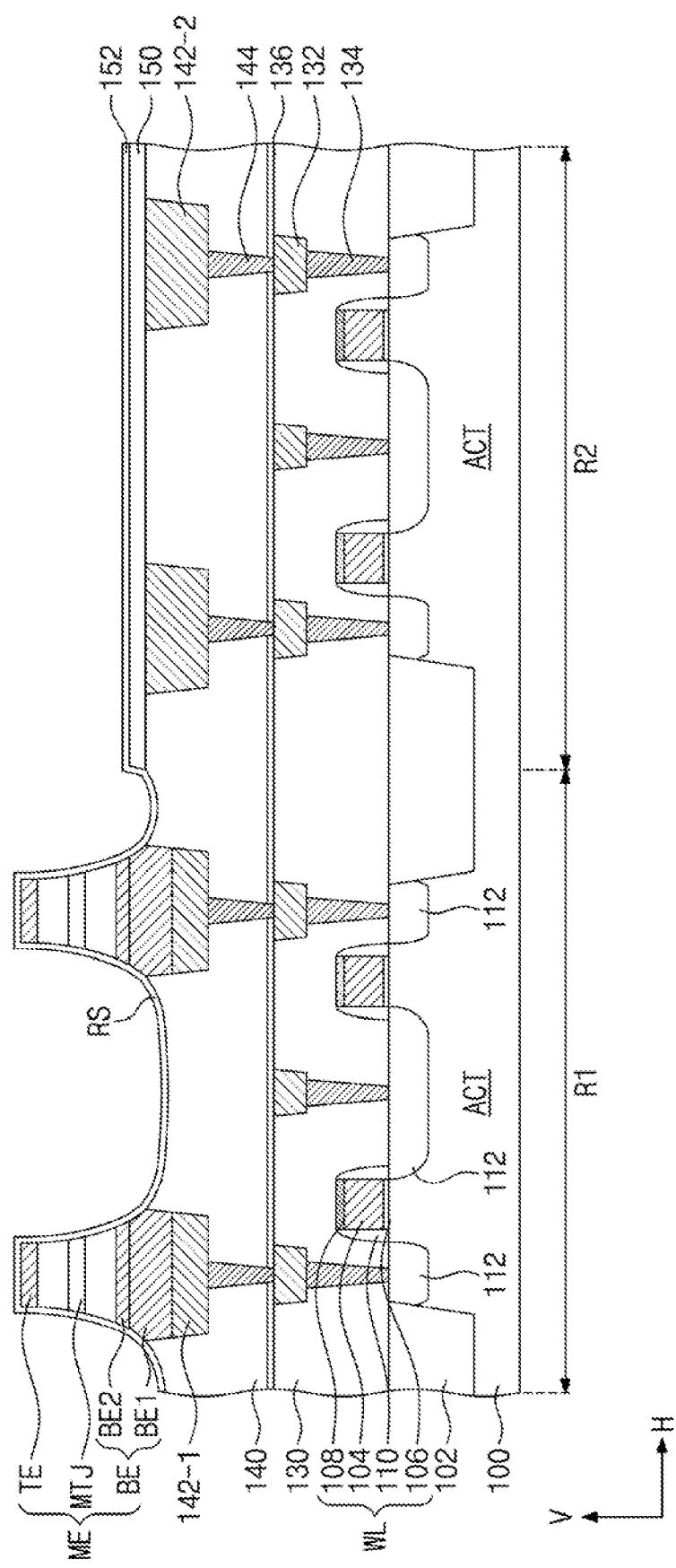

Referring to FIG. 17, on the second interlayer dielectric layer 140, a first protective layer 152 may be formed to cover top and lateral surfaces of the memory element ME. The first protective layer 152 may cover the capping layer 150 on the second region R2. The first protective layer 152 may prevent sidewalls of the magnetic tunnel junction MTJ from being oxidized during a subsequent process. The first protective layer 152 may be formed of, for example, silicon nitride.

Referring back to FIG. 4, a third interlayer dielectric layer 160 may be formed. The third interlayer dielectric layer 160 may fill a space between a plurality of memory elements ME and may cover the top surfaces of the memory elements ME. A top surface of the third interlayer dielectric layer 160 may be planarized. A step difference on the recessed top surface of the second interlayer dielectric layer 140 may cause the third interlayer dielectric layer 160 on the first region R1 to have a bottommost end at a lower level than that of the top surface of the second interlayer dielectric layer 140 on the second region R2.

A through electrode TV may be formed in the third interlayer dielectric layer 160. In an implementation, a mask pattern may be formed on the third interlayer dielectric layer 160, and then an etching process may be performed in which the mask pattern is used as an etching mask to etch the third interlayer dielectric layer 160. The etching process may form a via hole that penetrates the third interlayer dielectric layer 160 and exposes the second conductive pattern 142-2.

Afterwards, a conductive material may be coated or deposited to fill the via hole, thereby forming the through electrode TV.

A second etch stop layer 162 and a fourth interlayer dielectric layer 170 may be sequentially formed on the third interlayer dielectric layer 160.

A trench may be formed in the fourth interlayer dielectric layer 170 and the second etch stop layer 162, and then the trench may be filled with a conductive material to form an upper conductive pattern 172. The upper conductive pattern 172 may be coupled either to the memory element ME on the first region R1 or to the through electrode TV on the second region R2.

The processes discussed above may fabricate the semiconductor device of FIG. 4.

FIGS. 18 to 21 illustrate cross-sectional views of a method of fabricating a semiconductor device according to some example embodiments.

Figure 18:
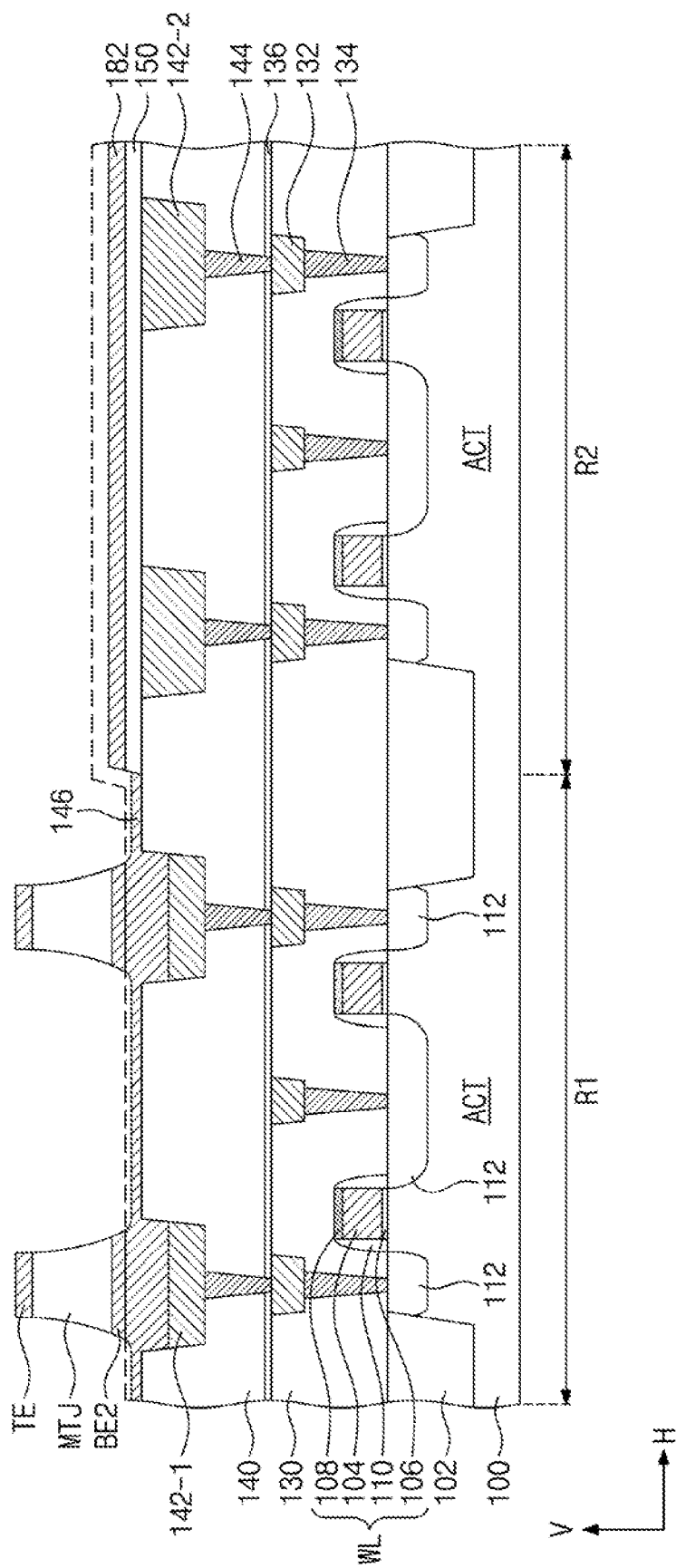
FIGS. 18 to 21 illustrate cross-sectional views of stages in a method of fabricating a semiconductor device according to some example embodiments.

Referring to FIG. 18, a patterning process may be performed on a resultant structure of FIG. 15. In an implementation, the bottom electrode layer 192, the magnetic tunnel junction layer 194, and the top electrode layer 196 may be patterned. The patterning process may be executed such that the bottom electrode layer 192, the magnetic tunnel junction layer 194, and the top electrode layer 196 are etched to respectively form a second bottom electrode BE2, a magnetic tunnel junction MTJ, and a top electrode TE. The patterning process may include forming a mask pattern on the top electrode layer 196, and performing an etching process that uses the mask pattern as an etching mask. The etching process may include, e.g., an ion beam etching process. The etching process may also etch a portion of the metal layer 146. In an implementation, on one side of the second bottom electrode BE2, the etching process may be performed to etch the metal layer 146 positioned on the top surface of the second interlayer dielectric layer 140. Therefore, the metal layer 146 may have a recessed top surface on the first region R1. In this case, an etch rate may be greater on the second region R2 where no pattern is formed than on the first region R1 where a pattern is formed, and the metal layer 146 may be removed from the second region R2. In an implementation, a portion of the metal layer 146 may remain on the second region R2.

Figure 19:
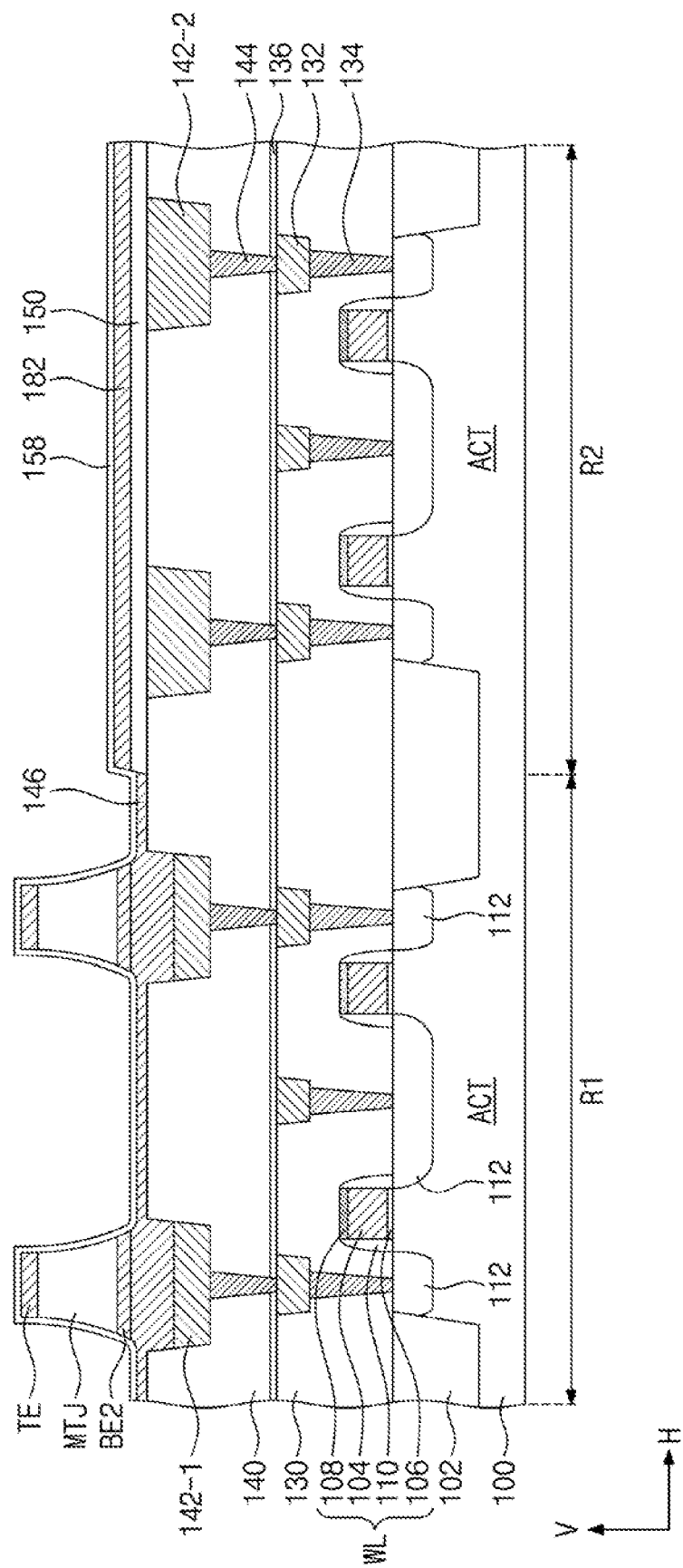

Referring to FIG. 19, on the second interlayer dielectric layer 140, a protective layer 158 may be formed to cover a lateral surface of the second bottom electrode BE2, a lateral surface of the magnetic tunnel junction MTJ, and a lateral surface of the top electrode TE. The protective layer 158 may cover the metal layer 146 on one side of the second bottom electrode BE2 on the first region R1. In an implementation, the protective layer 158 may conformally cover the recessed top surface of the metal layer 146 on the first region R1. The protective layer 158 may cover the dummy layer 182 on the second region R2. In the process discussed with reference to FIG. 18, when a portion of the metal layer 146 remains on the second region R2, the protective layer 158 may be formed to cover the remaining metal layer 146 on the second region R2. The protective layer 158 may be formed of silicon nitride.

Figure 20:
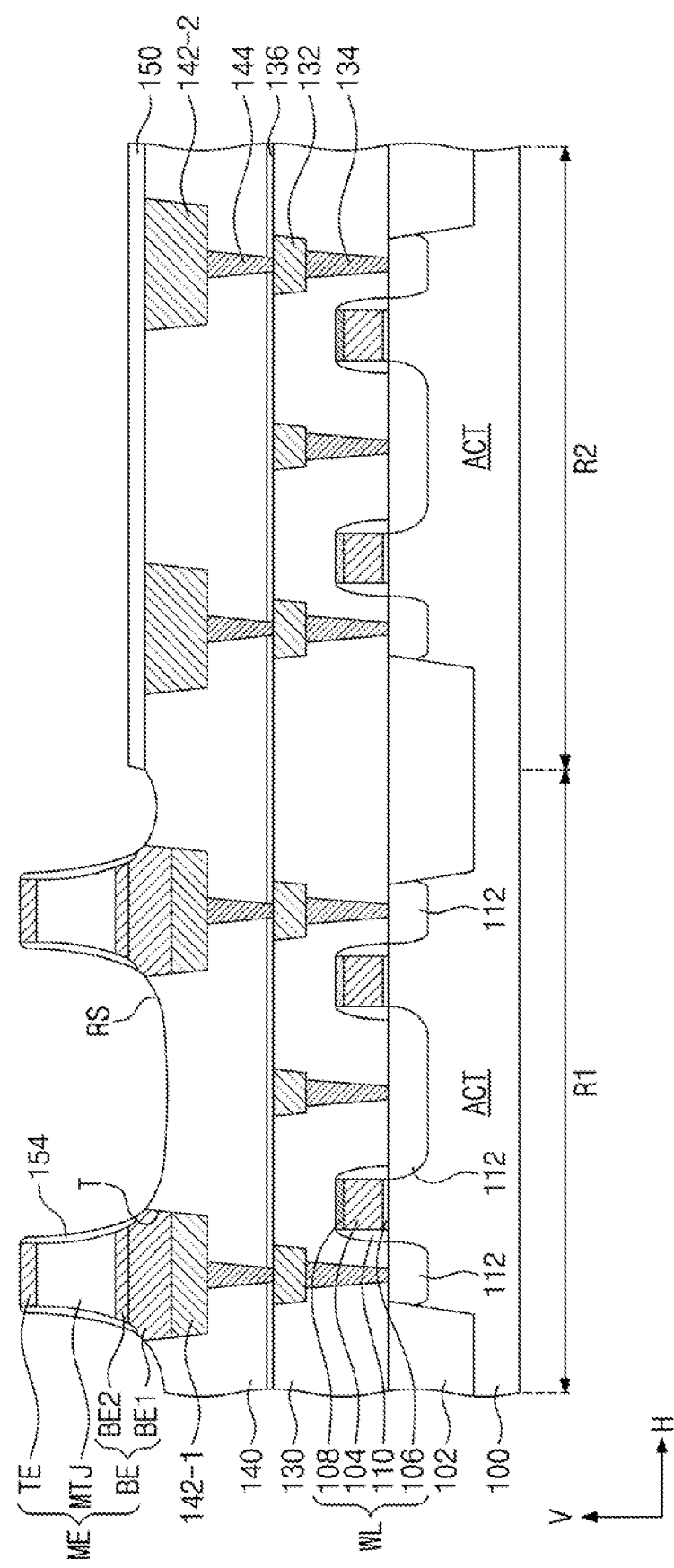

Referring to FIG. 20, an etching process may be performed on the protective layer 158. The etching process may partially etch the protective layer 158 positioned on the metal layer 146, thereby forming a second protective layer 154. The second protective layer 154 may cover the lateral surface of the second bottom electrode BE2, the lateral surface of the magnetic tunnel junction MTJ, and the lateral surface of the top electrode TE.

The etching process may also etch the metal layer 146. In an implementation, the metal layer 146 may be patterned to form a first bottom electrode BE1 that remains below the second bottom electrode BE2. In this case, on one side of the second bottom electrode BE2, the metal layer 146 may be removed from the top surface of the second interlayer dielectric layer 140, and the second bottom electrode BE2 may have a remaining metal layer 146 therebelow. A memory element ME may be constituted by the first bottom electrode BE1, the second bottom electrode BE2, the magnetic tunnel junction MTJ, and the top electrode TE. The first bottom electrode BE1 may have a lower segment in the trench T and an upper segment on the lower segment. On the lower segment of the first bottom electrode BE1, the second protective layer 154 may surround the upper segment of the first bottom electrode BE1. During the etching process performed on the metal layer 146 on the first region R1, the metal layer 146 may be removed from the second region R2.

In an implementation, the dummy layer 182 may serve as an etch stop layer to protect components on the second region R2 during the etching process, and the occurrence of failure may be reduced in fabrication of a semiconductor device.

During the etching process, the dummy layer 182 may be etched to expose a top surface of the capping layer 150. In an implementation, the dummy layer 182 may partially remain without being completely removed.

The etching process may also etch the second interlayer dielectric layer 140. Therefore, during the formation of the memory element ME, the second interlayer dielectric layer 140 may be etched at its upper portion exposed by the memory element ME, with the result that a recess RS may be formed on the first region R1. The second interlayer dielectric layer 140 may then have a recessed top surface on the first region R1 and a substantially flat top surface on the second region R2. In this case, a bottommost end of the recess RS may be located at a higher level than that of the top surface of the first conductive pattern 142-1, and the recess RS may be spaced apart from the first conductive pattern 142-1. The recess RS may expose an outer surface of the second protective layer 154 and a portion of the first bottom electrode BE1.

In an implementation, the first conductive pattern 142-1 may have a top surface lower than that of the second interlayer dielectric layer 140, and the first conductive pattern 142-1 may not be etched during the etching process. Accordingly, during the etching process, the memory element ME may be prevented from being contaminated due to an etch byproduct produced from the first conductive pattern 142-1 including copper.

Figure 21:
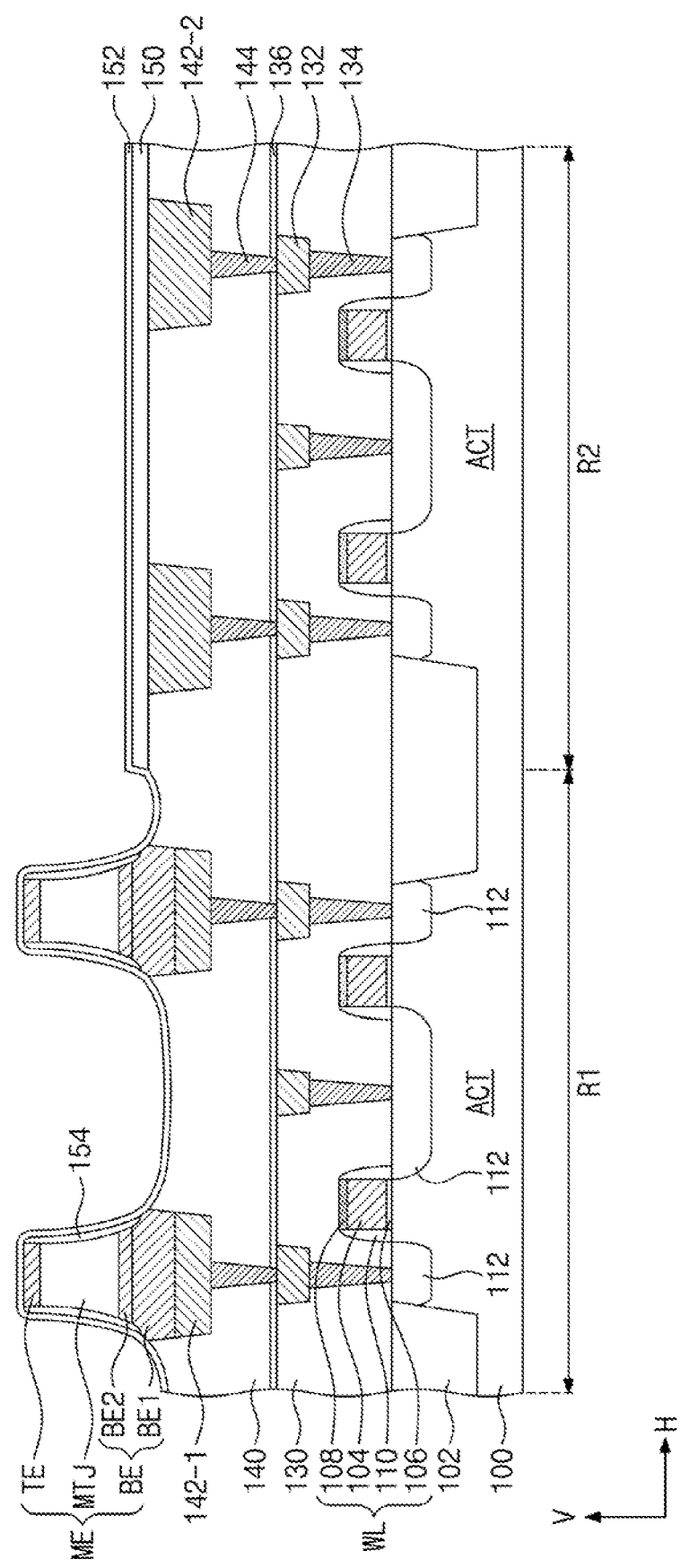

Referring to FIG. 21, on the second interlayer dielectric layer 140, a first protective layer 152 may be formed to cover top and lateral surfaces of the memory element ME. The first protective layer 152 may cover the capping layer 150 on the second region R2. The first protective layer 152 may help prevent sidewalls of the magnetic tunnel junction MTJ from being oxidized during a subsequent process. The first protective layer 152 may be formed of, e.g., silicon nitride.

Referring back to FIG. 6, a third interlayer dielectric layer 160 may be formed to fill a space between a plurality of memory elements ME and to cover the top surfaces of the memory elements ME.

A through electrode TV may be formed in the third interlayer dielectric layer 160. In an implementation, a mask pattern may be formed on the third interlayer dielectric layer 160, and then an etching process may be performed in which the mask pattern is used as an etching mask to etch the third interlayer dielectric layer 160. The etching process may form a via hole that penetrates the third interlayer dielectric layer 160 and exposes the second conductive pattern 142-2. Afterwards, a conductive material may be coated or deposited to fill the via hole, thereby forming the through electrode TV.

A second etch stop layer 162 and a fourth interlayer dielectric layer 170 may be sequentially formed on the third interlayer dielectric layer 160.

A trench may be formed in the fourth interlayer dielectric layer 170 and the second etch stop layer 162, and then the trench may be filled with a conductive material to form an upper conductive pattern 172. The upper conductive pattern 172 may be coupled either to the memory element ME on the first region R1 or to the through electrode TV on the second region R2.

The processes discussed above may fabricate the semiconductor device of FIG. 6.

FIGS. 22 to 26 illustrate cross-sectional views of a method of fabricating a semiconductor device according to some example embodiments.

Figure 22:
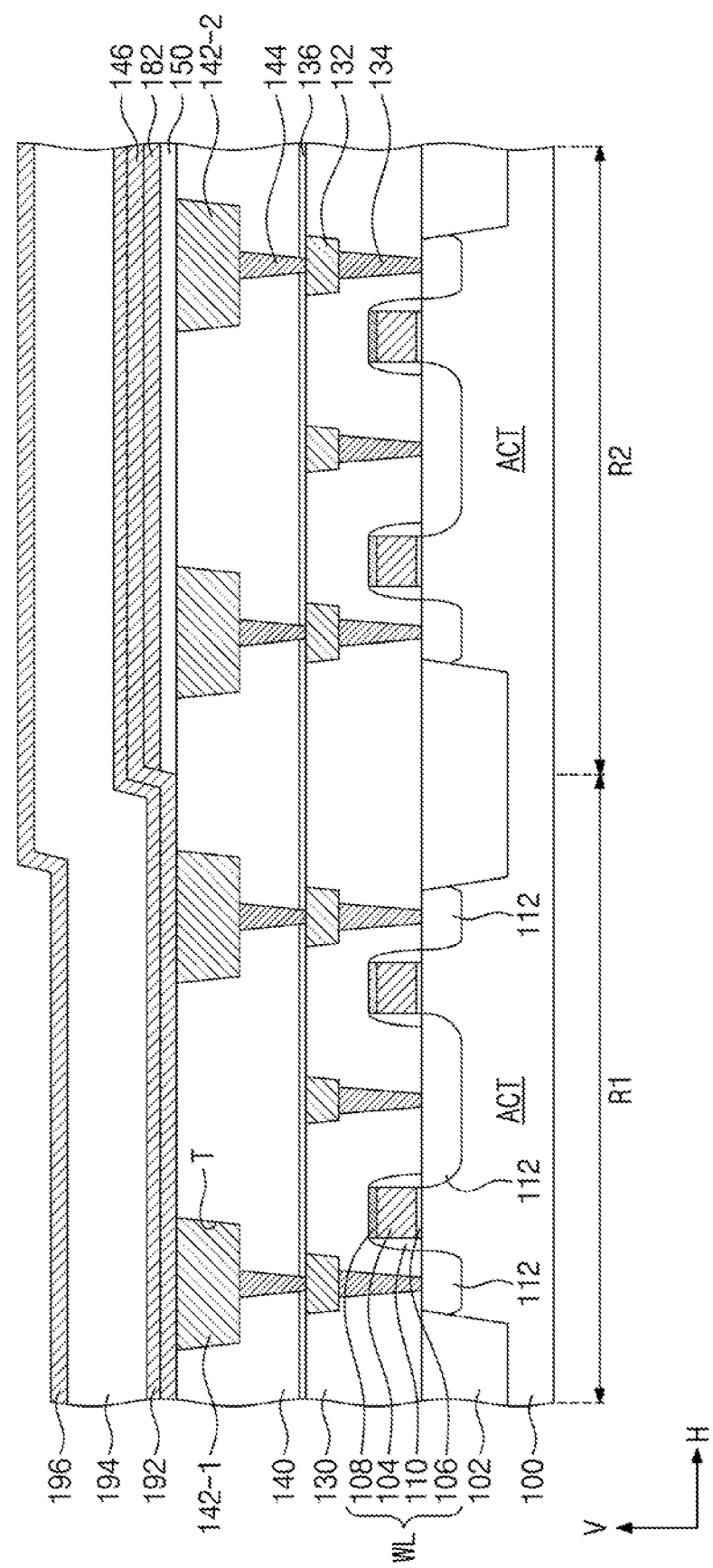
FIGS. 22 to 26 illustrate cross-sectional views of stages in a method of fabricating a semiconductor device according to some example embodiments.

Referring to FIG. 22, a metal layer 146 may be formed on a resultant structure of FIG. 12. The metal layer 146 may be formed by depositing a conductive material on the second interlayer dielectric layer 140. The conductive material may cover the top surface of the second interlayer dielectric layer 140 on the first region R1 and the top surface of the dummy layer 182 on the second region R2. The conductive material may include conductive metal nitride (e.g., tantalum nitride). The second interlayer dielectric layer 140 may include a different material from that of the dummy layer 182. In an implementation, the second interlayer dielectric layer 140 may include the same material as that of the dummy layer 182, and in this case, the second interlayer dielectric layer 140 and the dummy layer 182 may constitute a single unitary body.

A bottom electrode layer 192, a magnetic tunnel junction layer 194, and a top electrode layer 196 may be sequentially formed on the metal layer 146. In an implementation, the magnetic tunnel junction layer 194 may include a pinned layer, a tunnel barrier layer, and a free layer that are sequentially stacked on the bottom electrode layer 192. The bottom electrode layer 192, the pinned layer, the tunnel barrier layer, the free layer, and the top electrode layer 196 may be formed of the same material as that of the second bottom electrode BE2, the pinned layer PL, the tunnel barrier layer TBL, the free layer FL, and the top electrode TE, respectively, discussed with reference to FIG. 7.

Figure 23:
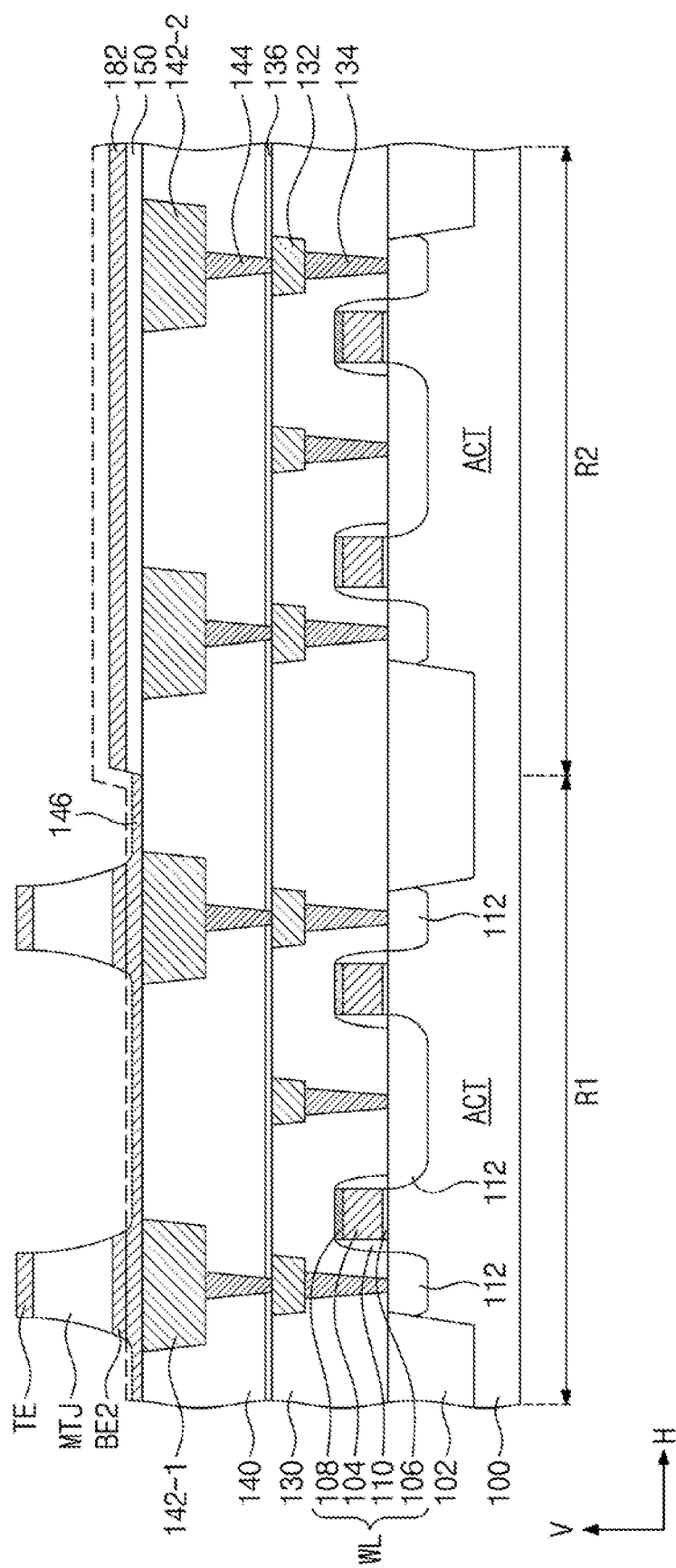

Referring to FIG. 23, a patterning process may be performed on the bottom electrode layer 192, the magnetic tunnel junction layer 194, and the top electrode layer 196. In an implementation, the bottom electrode layer 192, the magnetic tunnel junction layer 194, and the top electrode layer 196 may be patterned. The patterning process may be executed such that the bottom electrode layer 192, the magnetic tunnel junction layer 194, and the top electrode layer 196 are etched to respectively form a second bottom electrode BE2, a magnetic tunnel junction MTJ, and a top electrode TE. The patterning process may include forming a mask pattern (not shown) on the top electrode layer 196, and performing an etching process that uses the mask pattern as an etching mask. The etching process may include, for example, an ion beam etching process. The etching process may also etch a portion of the metal layer 146. In an implementation, on one side of the bottom electrode BE, the etching process may be performed to etch the metal layer 146 positioned on the top surface of the second interlayer dielectric layer 140. Therefore, the metal layer 146 may have a recessed top surface on the first region R1. In this case, an etch rate may be greater on the second region R2 where no pattern is formed than on the first region R1 where a pattern is formed, and the metal layer 146 may be removed from the second region R2. In an implementation, a portion of the metal layer 146 may remain on the second region R2.

Figure 24:
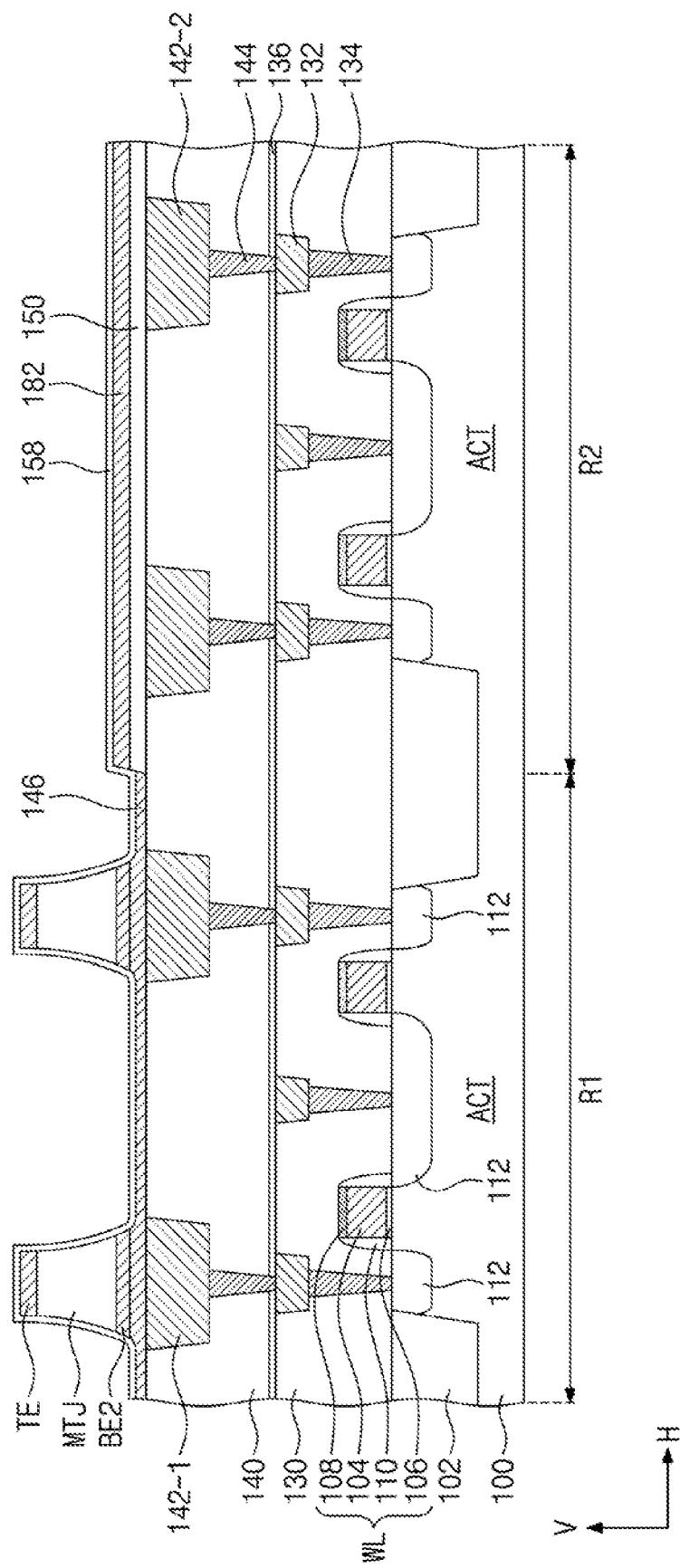

Referring to FIG. 24, on the second interlayer dielectric layer 140, a protective layer 158 may be formed to cover a lateral surface of the second bottom electrode BE2, a lateral surface of the magnetic tunnel junction MTJ, and a lateral surface of the top electrode TE. The protective layer 158 may cover the metal layer 146 on one side of the second bottom electrode BE2 on the first region R1. In an implementation, the protective layer 158 may conformally cover the recessed top surface of the metal layer 146 on the first region R1. The protective layer 158 may cover the dummy layer 182 on the second region R2. In the process discussed with reference to FIG. 23, when a portion of the metal layer 146 remains on the second region R2, the protective layer 158 may be formed to cover the remaining metal layer 146 on the second region R2. The protective layer 158 may be formed of silicon nitride.

Figure 25:
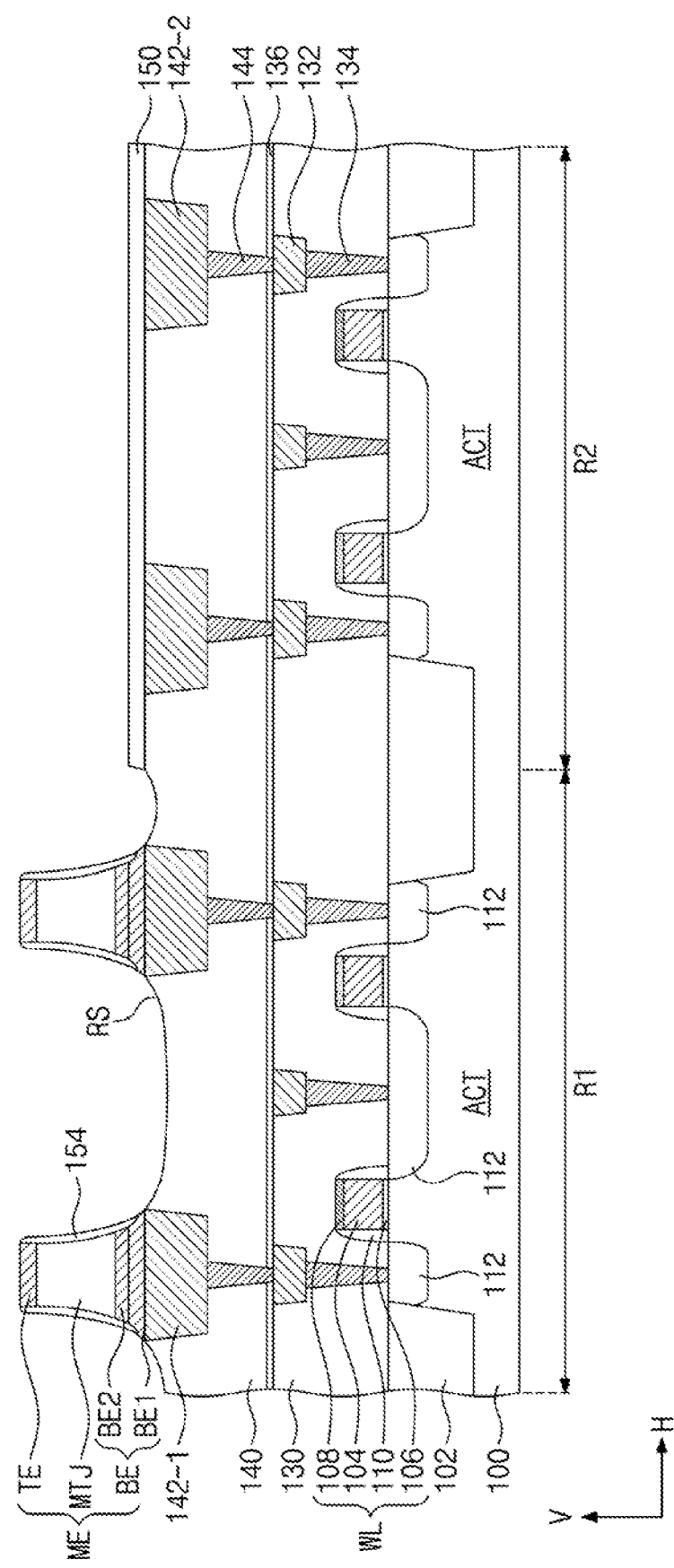

Referring to FIG. 25, an etching process may be performed on the protective layer 158. The etching process may partially etch the protective layer 158 positioned on the metal layer 146, thereby forming a second protective layer 154. The second protective layer 154 may cover the lateral surface of the second bottom electrode BE2, the lateral surface of the magnetic tunnel junction MTJ, and the lateral surface of the top electrode TE.

The etching process may also etch the metal layer 146. In an implementation, the metal layer 146 may be patterned to form a first bottom electrode BE1 that remains below the second bottom electrode BE2. In this case, on one side of the second bottom electrode BE2, the metal layer 146 may be removed from the top surface of the second interlayer dielectric layer 140, and the second bottom electrode BE2 may have a remaining metal layer 146 therebelow. A memory element ME may be constituted by the first bottom electrode BE1, the second bottom electrode BE2, the magnetic tunnel junction MTJ, and the top electrode TE. The first bottom electrode BE1 may have a lower segment on the first conductive pattern 142-1 and an upper segment on the lower segment. The first conductive pattern 142-1 may be located at a higher level than that of the top surface of the second interlayer dielectric layer 140. On the lower segment of the first bottom electrode BE1, the second protective layer 154 may surround the lower segment of the first bottom electrode BE1. During the etching process performed on the metal layer 146 on the first region R1, the metal layer 146 may be removed from the second region R2.

In an implementation, the dummy layer 182 may serve as an etch stop layer to protect components on the second region R2 during the etching process, and the occurrence of failure may be reduced in fabrication of a semiconductor device.

During the etching process, the dummy layer 182 may be etched to expose a top surface of the capping layer 150. In an implementation, the dummy layer 182 may partially remain without being completely removed.

In the etching process, the second interlayer dielectric layer 140 including a dielectric material may be etched at an etch rate greater than that at which the metal layer 146 including a metallic material is removed. Therefore, during the formation of the memory element ME, the second interlayer dielectric layer 140 may be etched at its upper portion exposed by the memory element ME, with the result that a recess RS may be formed on the first region R1. The second interlayer dielectric layer 140 may have a recessed top surface on the first region R1 and a substantially flat top surface on the second region R2. The recess RS may be spaced apart from the first conductive pattern 142-1. In an implementation, during the etching process, the recess RS may expose the first conductive pattern 142-1, and in this case, the first conductive pattern 142-1 may be partially etched.

In an implementation, the second protective layer 154 may protect a lateral surface of the memory element ME, and during the etching process, the memory element ME may be prevented from being contaminated due to an etch byproduct produced from the first conductive pattern 142-1 including copper.

Figure 26:
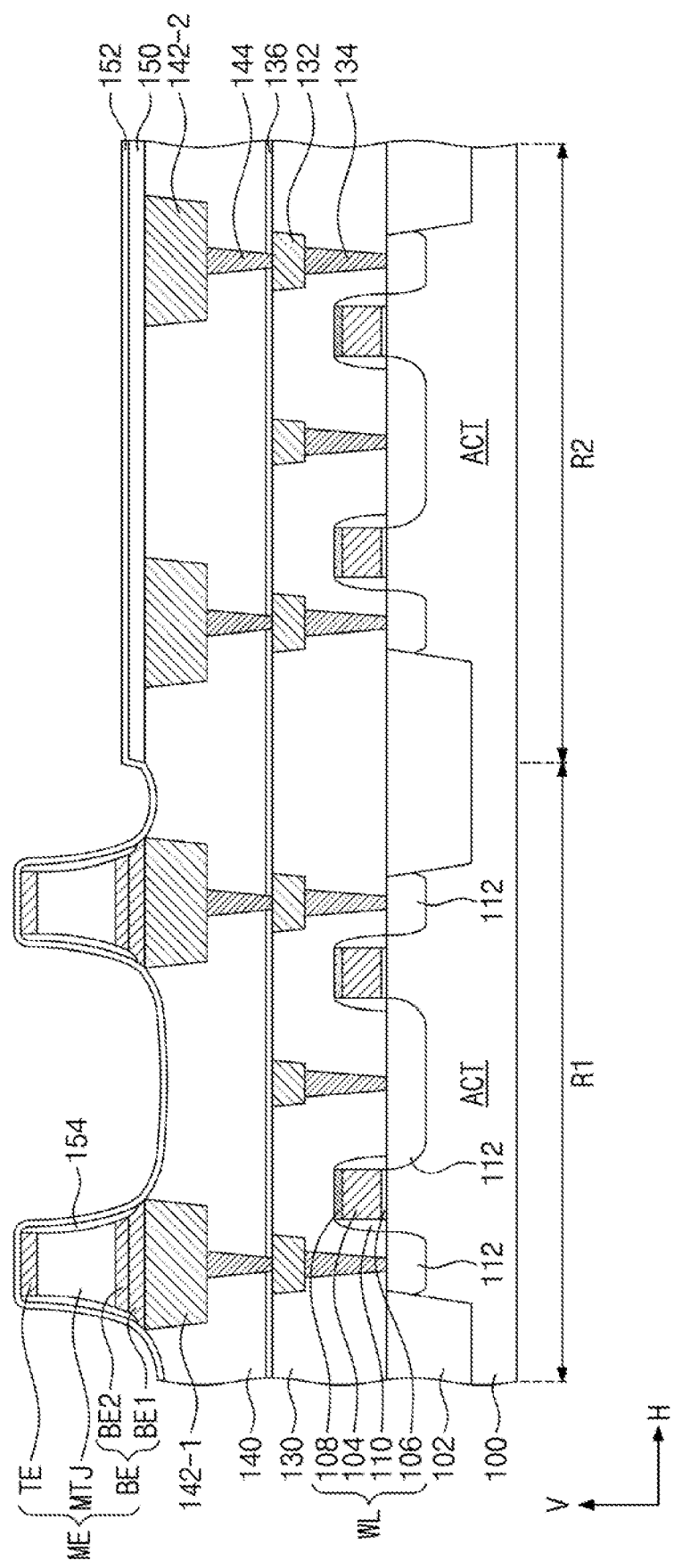

Referring to FIG. 26, on the second interlayer dielectric layer 140, a first protective layer 152 may be formed to cover top and lateral surfaces of the memory element ME. The first protective layer 152 may cover an outer surface of the second protective layer 154 on the first region R1. The first protective layer 152 may cover the capping layer 150 on the second region R2. The first protective layer 152 may prevent sidewalls of the magnetic tunnel junction MTJ from being oxidized during a subsequent process. The first protective layer 152 may be formed of, e.g., silicon nitride.

Referring back to FIG. 7, a third interlayer dielectric layer 160 may be formed. The third interlayer dielectric layer 160 may fill a space between a plurality of memory elements ME and may cover the top surfaces of the memory elements ME.

A through electrode TV may be formed in the third interlayer dielectric layer 160. In an implementation, a mask pattern may be formed on the third interlayer dielectric layer 160, and then an etching process may be performed in which the mask pattern is used as an etching mask to etch the third interlayer dielectric layer 160. The etching process may form a via hole that penetrates the third interlayer dielectric layer 160 and exposes the second conductive pattern 142-2. Afterwards, a conductive material may be coated or deposited to fill the via hole, thereby forming the through electrode TV.

A second etch stop layer 162 and a fourth interlayer dielectric layer 170 may be sequentially formed on the third interlayer dielectric layer 160.

A trench may be formed in the fourth interlayer dielectric layer 170 and the second etch stop layer 162, and then the trench may be filled with a conductive material to form an upper conductive pattern 172. The upper conductive pattern 172 may be coupled either to the memory element ME on the first region R1 or to the through electrode TV on the second region R2.

The processes discussed above may fabricate the semiconductor device of FIG. 7.

By way of summation and review, a flash memory device may have a slow operating speed, and some embedded semiconductor devices may have a limitation in terms of operating speed. Magnetic memory devices may be used as memory devices. The magnetic memory device may operate at high speed and may have nonvolatile characteristics, and may be a next-generation memory device.

With the remarkable advance in electronic industry, magnetic memory devices may exhibit high integration and/or low power consumption.

One or more embodiments may provide a semiconductor device including an embedded magnetic memory element.

One or more embodiments may provide a compact-sized semiconductor device.

One or more embodiments may provide a method of fabricating a semiconductor device in which the occurrence of failure is decreased.

A semiconductor device according to some example embodiments may not require a separate space for a contact between a memory element and a second lower conductive pattern, and thus may have a small spacing between an upper conductive pattern and the second lower conductive pattern. Accordingly, it may be possible to provide a compact-sized semiconductor device.

A method of fabricating a semiconductor device according to some example embodiments may help prevent the memory element from contamination, which could otherwise be caused by an etch byproduct produced from the second lower conductive pattern in a process in which the memory element is patterned.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   providing a substrate that includes a first region and a second region;
   forming a first lower conductive pattern on the first region and a second lower conductive pattern on the second region, the first lower conductive pattern and the second lower conductive pattern being buried in an interlayer dielectric layer on the substrate;
   forming a capping layer on the interlayer dielectric layer and a dummy layer on the capping layer, the capping layer covering the second region;
   etching an upper portion of the first lower conductive pattern to form a trench, the first lower conductive pattern being exposed in the trench;
   forming a metal layer that covers the interlayer dielectric layer on the first region and the dummy layer on the second region such that the metal layer fills the trench on the first region;
   forming a magnetic tunnel junction layer on the metal layer;
   performing a patterning process to pattern the magnetic tunnel junction layer to form a memory cell; and
   forming a first protective layer that covers the second region and a lateral surface of the memory cell,
   wherein, in the patterning process, the metal layer on a top surface of the interlayer dielectric layer is etched to form a first bottom electrode in the trench.

2. The method as claimed in claim 1, wherein, in the patterning process, the metal layer and the dummy layer are simultaneously removed from on the second region.

3. The method as claimed in claim 1, wherein:
   a portion of the metal layer on the trench is etched in the patterning process,
   the first bottom electrode includes:
      a lower segment in the trench; and
      an upper segment on the lower segment, and
      a first lateral surface of the upper segment is inclined relative to a second lateral surface of the lower segment.

4. The method as claimed in claim 3, wherein the first protective layer covers the lateral surface of the memory cell and the first lateral surface of the upper segment of the first bottom electrode.

5. The method as claimed in claim 3, wherein, in the patterning process, an upper portion of the interlayer dielectric layer is partially etched to form a recess on the first region, the recess protruding downwardly toward the substrate from the top surface of the interlayer dielectric layer at one side of the memory cell.

6. The method as claimed in claim 5, wherein a bottommost end of the recess is farther away from the substrate than a top surface of the first lower conductive pattern.

7. The method as claimed in claim 5, wherein:
   the recess exposes the first lateral surface of the upper segment of the first bottom electrode, and
   the recess is spaced apart from the first lower conductive pattern.

8. The method as claimed in claim 5, wherein the first protective layer extends into the recess and covers an inner surface of the recess.

9. The method as claimed in claim 1, wherein:
   the patterning process includes:
      etching the magnetic tunnel junction layer to form the memory cell;
      forming a second protective layer that covers the lateral surface of the memory cell; and
      etching the metal layer on the top surface of the interlayer dielectric layer to form the first bottom electrode in the trench,
   the first protective layer covers an outer surface of the second protective layer, the top surface of the interlayer dielectric layer exposed by etching the metal layer and the second region,
   the first bottom electrode includes:
      a lower segment in contact with the first lower conductive pattern; and
      an upper segment surrounded by the second protective layer, the upper segment protruding from the lower segment, and
      a lateral surface of the first bottom electrode is continuous with the outer surface of the second protective layer.

10. A method of fabricating a semiconductor device, the method comprising:
    providing a substrate that includes a first region and a second region;
    forming a first lower conductive pattern on the first region and a second lower conductive pattern on the second region, the first lower conductive pattern and the second lower conductive pattern being buried in an interlayer dielectric layer on the substrate;
    forming a capping layer and a dummy layer on the capping layer, the capping layer covering the interlayer dielectric layer on the second region;
    forming a conductive layer and a magnetic tunnel junction layer on the conductive layer, the conductive layer covering the interlayer dielectric layer on the first region and the dummy layer on the second region;
    performing a first etching process on the magnetic tunnel junction layer to form a memory cell;
    forming a protective layer that covers a lateral surface of the memory cell;

performing a second etching process on the protective layer and the conductive layer at one side of the memory cell, the second etching process forming an inner protective layer on the lateral surface of the memory cell and a first bottom electrode between the first lower conductive pattern and the memory cell; and forming an outer protective layer that covers an outer surface of the inner protective layer, a top surface of the interlayer dielectric layer exposed by the second etching process, and the second region.

11. The method as claimed in claim 10, wherein:
in the first etching process, a portion of the conductive layer at the one side of the memory cell is etched to form a first recess, and
the outer protective layer extends into the first recess.

12. The method as claimed in claim 11, wherein:
the second etching process is performed on the first recess, and
after the second etching process, the first bottom electrode has a step difference on a lateral surface of the first bottom electrode.

13. The method as claimed in claim 10, wherein:
the first bottom electrode includes:
a lower segment in contact with the first lower conductive pattern; and
an upper segment by the inner protective layer, the upper segment being on the lower segment, and
a lateral surface of the first bottom electrode is continuous with the outer surface of the inner protective layer.

14. The method as claimed in claim 13, wherein the outer protective layer is in contact with the outer surface of the inner protective layer and a lateral surface of the lower segment of the first bottom electrode.

15. The method as claimed in claim 10, wherein, on the first region, the outer protective layer is in contact with the inner protective layer and the top surface of the interlayer dielectric layer that is exposed by the first bottom electrode.

16. The method as claimed in claim 10, wherein:
the outer protective layer extends onto the capping layer on the second region, and
the capping layer is in contact with the second lower conductive pattern and the outer protective layer.

17. The method as claimed in claim 10, wherein, in the second etching process, an upper portion of the interlayer dielectric layer is partially etched to form a second recess on the first region, the second recess protruding downwardly toward the substrate from the top surface of the interlayer dielectric layer at the one side of the memory cell.

18. The method as claimed in claim 10, further comprising forming a dielectric layer on the outer protective layer,
wherein, a bottommost end of the dielectric layer on the first region is at a level lower than a level of a top surface of the capping layer on the second region.

19. The method as claimed in claim 10, further comprising forming a trench on the first region by etching an upper portion of the first lower conductive pattern exposed at the top surface of the interlayer dielectric layer, before forming the dummy layer,
wherein the dummy layer fills the trench and covers the interlayer dielectric layer on the first region and the dummy layer on the second region.

* * * * *